United States Patent
Vitale et al.

(10) Patent No.: US 12,199,141 B2
(45) Date of Patent: Jan. 14, 2025

(54) SEMICONDUCTOR DEVICE WITH GRADUAL INJECTION OF CHARGE CARRIERS FOR SOFTER REVERSE RECOVERY

(71) Applicant: Hitachi Energy Ltd, Zürich (CH)

(72) Inventors: Wolfgang Amadeus Vitale, Aarau (CH); Luca De-Michielis, Aarau (CH); Boni Kofi Boksteen, Lenzburg (CH); Elizabeth Buitrago, Windisch (CH); Maxi Andenna, Dättwil (CH)

(73) Assignee: Hitachi Energy Ltd, Zürich (CH)

( * ) Notice: Subject to any disclaimer, the term of this patent is extended or adjusted under 35 U.S.C. 154(b) by 239 days.

(21) Appl. No.: 17/912,243

(22) PCT Filed: Mar. 12, 2021

(86) PCT No.: PCT/EP2021/056353
§ 371 (c)(1),
(2) Date: Sep. 16, 2022

(87) PCT Pub. No.: WO2021/185696
PCT Pub. Date: Sep. 23, 2021

(65) Prior Publication Data
US 2023/0187488 A1 Jun. 15, 2023

(30) Foreign Application Priority Data
Mar. 17, 2020 (EP) .................................... 20163706

(51) Int. Cl.
*H01L 29/861* (2006.01)
*H01L 21/265* (2006.01)
(Continued)

(52) U.S. Cl.
CPC .... *H01L 29/0623* (2013.01); *H01L 21/26513* (2013.01); *H01L 21/266* (2013.01); *H01L 29/66136* (2013.01); *H01L 29/8613* (2013.01)

(58) Field of Classification Search
CPC ........... H01L 29/0623; H01L 21/26513; H01L 21/266; H01L 29/66136; H01L 29/8613; H01L 29/36; H01L 29/861
See application file for complete search history.

(56) References Cited

U.S. PATENT DOCUMENTS 6,037,632 A * 3/2000 Omura ................ H01L 29/7835
257/E29.198
8,476,712 B2 7/2013 Baburske et al.
(Continued)

FOREIGN PATENT DOCUMENTS

| CN | 101572233 A | 11/2009 |
| CN | 102318071 A | 1/2012 |

(Continued)

OTHER PUBLICATIONS

Chen, M., et al., "A Novel Diode Structure with Controlled Injection of Backside Holes (CIBH)", Proceedings of the 18th International Symposium on Power Semiconductor Devices & IC's, Naples, Italy, Jun. 4-8, 2006, 4 pages.
(Continued)

*Primary Examiner* — David Vu
(74) *Attorney, Agent, or Firm* — Slater Matsil, LLP

(57) ABSTRACT

A semiconductor device a first semiconductor layer of a first conductivity type at a first main side of a semiconductor wafer and a second semiconductor layer of a second conductivity type at second main side. The second semiconductor layer forms a pn junction with the first semiconductor layer. A first electrode is in ohmic contact with the first semiconductor layer and a second electrode layer is in ohmic contact with the second semiconductor layer. A first semi- (Continued)

conductor region of the first conductivity type completely embedded in the second semiconductor layer and a second semiconductor region of the first conductivity type completely embedded in the second semiconductor layer.

20 Claims, 13 Drawing Sheets

(51) Int. Cl.
*H01L 21/266* (2006.01)
*H01L 29/06* (2006.01)
*H01L 29/66* (2006.01)

(56) References Cited

U.S. PATENT DOCUMENTS

| | | |
|---|---|---|
| 9,449,926 B2 | 9/2016 | Nakanishi |
| 2007/0278472 A1 | 12/2007 | Mauder et al. |
| 2008/0283868 A1 | 11/2008 | Schulze et al. |
| 2009/0267200 A1 | 10/2009 | Gutt et al. |
| 2011/0278694 A1 | 11/2011 | Rahimo et al. |
| 2012/0018846 A1 | 1/2012 | Baburske et al. |
| 2012/0286323 A1 | 11/2012 | Werber |
| 2016/0111528 A1 | 4/2016 | Schulze et al. |
| 2016/0380059 A1 | 12/2016 | Losee et al. |
| 2017/0278924 A1 | 9/2017 | Bolotnikov et al. |
| 2018/0040691 A1 | 2/2018 | Breymesser et al. |

FOREIGN PATENT DOCUMENTS

| | | |
|---|---|---|
| CN | 103208531 A | 7/2013 |
| CN | 105529359 A | 4/2016 |
| CN | 107680905 A | 2/2018 |
| CN | 107810558 A | 3/2018 |
| DE | 102006025958 B3 | 10/2007 |
| IN | 102779856 A | 11/2012 |
| JP | 2003101035 A | 4/2003 |
| JP | 2004327824 A | 11/2004 |
| JP | 2008235590 A | 10/2008 |
| JP | 2018523301 A | 8/2018 |
| JP | 2019510376 A | 4/2019 |

OTHER PUBLICATIONS

Felsl, H., et al., "IGBT Field-Stop Design for Good Short Circuit Ruggedness and a Better Trade-off with Respect to Static and Dynamic Switching Characteristics", Proceedings of the 29th International Symposium on Power Semiconductor Devices & IC's, Sapporo, Japan, May 28, 2017, 4 pages.

Felsl, H., et al., "The CIBH Diode—Great Improvement for Ruggedness and Softness of High Voltage Diodes", Proceedings of the 20th International Symposium on Power Semiconductor Devices & IC's, Orlando, FL, May 18-22, 2008, 4 pages.

Rahimo, M., et al., "The Field Charge Extraction (FCE) Diode: A Novel Technology for Soft Recovery High Voltage Diodes", Proceedings of the 17th International Symposium on Power Semiconductor Devices and IC's, Santa Barbara, CA, USA, May 23-26, 2005, 5 pages.

* cited by examiner

SEMICONDUCTOR DEVICE WITH GRADUAL INJECTION OF CHARGE CARRIERS FOR SOFTER REVERSE RECOVERY

CROSS-REFERENCE TO RELATED APPLICATIONS

This application is a national stage application of International Application No. PCT/EP2021/056353, filed on Mar. 12, 2021, which claims priority to European Patent Application No. 20163706.3, filed on Mar. 17, 2020, which applications are hereby incorporated herein by reference.

TECHNICAL FIELD

The present invention relates to a semiconductor device comprising a with gradual injection of charge carriers for softer reverse recovery.

BACKGROUND

A diode (diode structure) comprises an anode electrode in electric contact with a p-doped semiconductor layer, an n-doped semiconductor layer forming a pn-junction with the p-doped semiconductor layer, and a cathode electrode in electric contact with the n-doped semiconductor layer. Such diode allows an electric current to pass in one direction (the so-called forward direction) and blocks the current in the opposite direction (the so-called reverse direction). When a voltage applied to the electrodes of the diode is switched from forward bias to reverse bias, or turned off, then the diode does not instantly cease to pass current but continues for a short time to conduct a current in the reverse direction (also referred to as a reverse current) until the stored charge (plasma of free charge carriers) at the pn junction is removed and the depletion zone is re-established. This process is known as reverse recovery.

During reverse recovery there is known the phenomena of snappy recovery (or snap-off), which refers to a sudden steep drop of the reverse current (current discontinuity). The main reason is lack of free charge carriers at the end of the reverse recovery process in a region close to the cathode while there are still remaining free charge carriers in a region further away from the cathode. Current snap-off can cause current and voltage oscillations (see FIGS. 4A and 4B) between the capacitance of the diode and parasitic inductances of a circuit in which the diode is used. Such oscillations are undesirable because they can lead to failures due to high voltage peaks (voltage overshoot, VR_max in FIG. 4A) and electromagnetic interference and is particularly critical when the diode is subjected to fast commutation velocity (di/dt) and in high voltage diodes when the switching is performed at a relatively low current level. It is therefore desirable to achieve a soft recovery behavior during turn off or commutation. Whether the recovery is snappy or soft depends on how the stored charge (plasma of free charge carriers) is removed and thus depends on the diode design and the switching conditions.

In order to achieve a soft recovery behavior of the diode, the internal distribution of concentration of free charge carriers (electrons and holes) in the diode can be configured such that it is low at the anode side. A reduction of the free charge carrier distribution at the anode side is realized, e.g., in Emcon diodes (Emitter Controlled diodes), MPS diodes (Merged PiN Schottky diodes) and CAL diodes (Controlled Axial Lifetime Diodes). However, this approach has the drawback that with the reduction of the free charge carrier distribution at the anode side, the anodal emitter efficiency is also reduced.

Another way to make device turn-off or commutation softer is to utilize the Field Charge Extraction (FCE) effect, as it is done in the FCE diode. In such a diode, additional p+-type regions are embedded in an n+-type cathode layer (n+ emitter) and electrically connected (shorted) to each other by a cathode electrode. During reverse recovery, electrons initially stored in the n--type base of the FCE diode flow towards the cathode electrode and thereby preferably pass through the n+-type cathode layer. At the end of the reverse recovery phase, the electric field comes close to the cathode layer and triggers an injection of holes from the p+-type regions. This hole current adds to the reverse recovery current originating from the stored free charge carriers and slows down the depletion of the free charge carriers underneath the p+-type regions of the FCE cathode. In this way a current snap-off can be prevented and soft recovery is achieved. But the replacement of a part of the n+-type cathode layer by p+-type region leads to decreased emitter efficiency at the cathode side because a part of the cathode area is lost for injection of free charge carriers into the internal plasma. Therefore, the forward voltage drop of the diode will be increased.

A CIBH (controlled injection of backside holes) structure avoids this disadvantage. It contains a floating p-doped layer in front of an n+-doped cathode layer. The floating p-doped layer is interrupted by n-type areas. The individual portions of the floating p-doped layer are at a same distance from the cathode electrode and similarly doped. During reverse recovery the floating p-doped layer inject holes into the base region of the diode, which move towards the anode electrode. Due to this injection of holes, evolution of a high electric field peak at the cathode side is suppressed and plasma removal out of the base region is slowed down. Hence, snap-off of the diode can be suppressed and ruggedness and softness of the diode may be improved. However, this approach presents drawbacks in terms of on-state losses (conduction losses in forward operation).

Document JP 2008 235590 A discloses a diode having an improved breakdown voltage comprising a p-type layer and an n-type layer, the n-type layer comprising a first plurality of p-type impurity regions and a second plurality of p-type impurity regions. The first plurality of p-type impurity regions is embedded at a first depth with respect to the diode's pn junction, and the second plurality of p-type impurity regions is embedded at a second depth with respect to the pn junction.

Document US 2016/0380059 A1 discloses a silicon carbide (SiC) super-junction (SJ) power devices, which includes an active area having two or more charge balance (CB) layers. Each CB layer includes a semiconductor layer having a first conductivity-type and a plurality of floating regions having a second conductivity-type disposed in a surface of the semiconductor layer. The plurality of floating regions and the semiconductor layer are both configured to substantially deplete to provide substantially equal amounts of charge from ionized dopants when a reverse bias is applied to the SiC-SJ device.

Document "The CIBH Diode—Great Improvement for Ruggedness and Softness of High Voltage Diodes" by FELSL H. P. et al, POWER SEMICONDUCTOR DEVICES and IC'S, 2008, ISPSD '08, 20TH INTERNATIONAL SYMPOSIUM ON, IEEE, PISCATAWAY, NJ, USA, 18 May 2008, pages 173-176 (ISBN: 978-1-4244-1532-8) discloses the concept of Controlled Injection of Backside Holes (CIBH) for an optimization of electrical characteristics by introducing p-doped layers at a cathode side of a diode, which inject holes in a base region during reverse recovery.

Document US 2018/0040691 A1 discloses a semiconductor diode exploiting a CIBH concept.

SUMMARY

Embodiments of the present invention relate to a semiconductor device comprising a diode structure, which exhibits soft recovery behavior and low on-state conduction loss, and to a manufacturing method thereof.

Embodiments of the invention provide a semiconductor device that has improved electric properties, exemplarily by exhibiting soft recovery behavior (e.g., reduced voltage overshoot and reduced voltage and current oscillations) and low on-state conduction losses (reduced forward voltage drop). Further embodiments of the invention provide a manufacturing method to manufacture such a semiconductor device.

BRIEF DESCRIPTION OF THE DRAWINGS

The foregoing and other objects, advantages and features of the invention, and the manner in which the same are accomplished, will become more readily apparent upon consideration of the following detailed description of the invention taken in conjunction with the accompanying schematic drawings, which illustrate exemplary embodiments, and wherein.

DETAILED DESCRIPTION OF ILLUSTRATIVE EMBODIMENTS

Figure 1A:
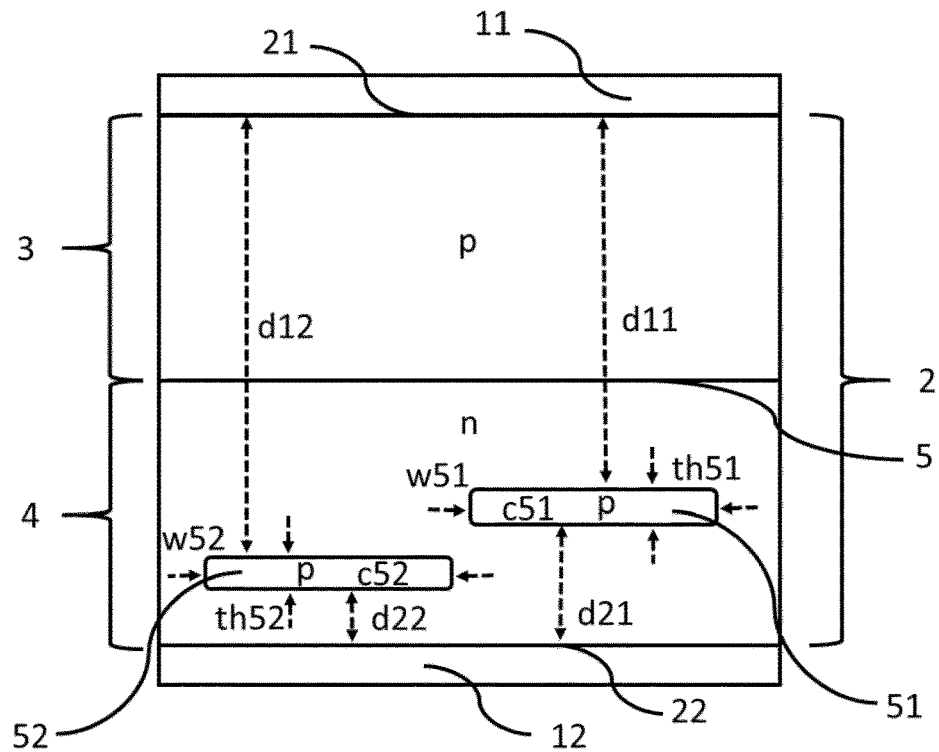
FIG. 1A shows a schematic vertical cross-sectional view of a diode according to an exemplary embodiment depicting aspects of the invention.

Embodiments will be described in text followed by a description of the drawings.

A semiconductor device according to an embodiment of the invention comprises a semiconductor wafer having a first main side and a second main side opposite to the first main side, a first electrode layer on the first main side, and a second electrode layer on the second main side.

The semiconductor wafer comprises in an order from the first main side to the second main side a first semiconductor layer of a first conductivity type in ohmic contact with the first electrode layer and a second semiconductor layer of a second conductivity type in ohmic contact with the second electrode layer. The second conductivity type is different from the first conductivity type, and the first semiconductor layer forms a first pn junction with the second semiconductor layer.

The second semiconductor layer comprises a third semiconductor layer of the second conductivity type, a fourth semiconductor layer of the second conductivity type and a fifth semiconductor layer of the second conductivity type between the third semiconductor layer and the fourth semiconductor layer. The third semiconductor layer forms the first pn junction with the first semiconductor layer. The fourth semiconductor layer is in said ohmic contact with the second electrode layer and has a maximal doping concentration which is at least one order of magnitude higher than a maximal doping concentration of the third semiconductor layer. The fifth semiconductor layer has a maximal doping concentration which is lower than the maximal doping concentration of the fourth semiconductor layer and which is higher than the maximal doping concentration of the third semiconductor layer.

A first semiconductor region of the first conductivity type and a second semiconductor region of the first conductivity type are completely embedded in the fifth semiconductor layer. The first semiconductor region is configured to stop injecting charge carriers of the first conductivity type into the second semiconductor layer at a first time point during reverse recovery, the second semiconductor region is configured to stop injecting charge carriers of the first conductivity type into the second semiconductor layer at a second time point during reverse recovery, and the first time point is different from the second time point. In other words, during reverse recovery, a first conductivity type injection duration of the first semiconductor region is different from a first conductivity type charge carrier injection duration of the second semiconductor region.

This has the effect that, for example the first semiconductor region continues to inject charge carriers into the second semiconductor layer, after the second semiconductor region has stopped injecting charge carriers into the second semiconductor layer. By this a depletion process during reverse recovery is slowed down and snappy recovery is prevented. Thus, a voltage overshoot and voltage and current oscillations during reverse recovery are reduced. Moreover, such configuration may be beneficial in view of minimizing conduction losses in forward operation.

The stopping of injecting charge carriers into the second semiconductor layer at different time points, i.e., the different first conductivity type injection durations, may be achieved by having a different distance of the first and second semiconductor region to the first main side and/or to the second main side and/or by the first and second semiconductor region having different maximal doping concentration. Also a combination of different distances and/or different distance and different maximal doping concentration is possible.

In an exemplary embodiment, a distance of the first semiconductor region to the second main side is different from a distance of the second semiconductor region to the second main side. This is a first example of how to configure the first semiconductor region and the second semiconductor region to stop injecting charge carriers at different time points. In addition to greatly reducing voltage overshoot and voltage and current oscillations (e.g., improving the softness), such configuration may provide the advantage of not increasing conduction losses in forward operation (on-state conduction losses).

In an exemplary embodiment, a distance of the first semiconductor region to the first main side is different from a distance of the second semiconductor region to the first main side. This is a second example of how to configure the first and second semiconductor regions to stop injecting charge carriers at different time points, and also helps to reduce voltage overshoot and voltage and current oscillations, while not increasing conduction losses in forward operation.

In an exemplary embodiment the first semiconductor region overlaps with the second semiconductor region in an orthogonal projection onto a plane parallel to the second main side. By this an injection of charge carriers into the second semiconductor layer may be prolonged compared to a configuration without such overlap and thus an ability to stop injecting charge carriers into the second semiconductor layer at different time points during reverse recovery may be improved. In addition, such configuration may increase a blocking voltage of the device.

In an exemplary embodiment, a maximal doping concentration of the first semiconductor region is different from a maximal doping concentration of the second semiconductor region. This is a third example of how to configure the first semiconductor region and the second semiconductor region to stop injecting charge carriers at different time points.

In an exemplary embodiment, the first semiconductor region and the second semiconductor region are separated from each other. This means that they are not in direct contact with each other. Thus, depending on their location within the second semiconductor layer, they are biased to different potentials. This may improve their ability to stop injecting charge carriers at different time points.

In an exemplary embodiment, the first semiconductor region and the second semiconductor region do not overlap with each other in any orthogonal projection onto a plane perpendicular to the second main side. This may improve their ability to stop injecting charge carriers at different time points.

In an exemplary embodiment, the first semiconductor region and the second semiconductor region are closer to the second main side than to the first pn junction.

A method for manufacturing the semiconductor device according to the invention comprises providing a semiconductor wafer having a first main side and a second main side opposite to the first main side, forming a first electrode layer on the first main side, and forming a second electrode layer on the second main side. The step of providing the semiconductor wafer comprises providing a semiconductor substrate of the second conductivity type, the semiconductor substrate having a third main side and a fourth main side opposite to the third main side, applying, for example by implantation, first dopants of the first conductivity type at the fourth main side for forming a first semiconductor region, thereafter, forming a sixth semiconductor layer of the second conductivity type on the fourth main side, the sixth semiconductor layer having a fifth main side coinciding with the fourth main side and a sixth main side opposite to the fifth main side, thereafter, applying, for example by implantation, second dopants of the first conductivity type at the sixth main side for forming a second semiconductor region, thereafter, forming a seventh semiconductor layer of the second conductivity type on the sixth main side, the seventh semiconductor layer having a seventh main side coinciding with the sixth main side and a eighth main side opposite to the seventh main side, and forming the first semiconductor region and the second semiconductor region by performing at least one annealing step to activate the applied first dopants and the applied second dopants.

In an exemplary embodiment, the sixth semiconductor layer and the seventh semiconductor layer are formed by epitaxy.

In an exemplary embodiment, the forming of the sixth semiconductor layer and forming of the seventh semiconductor layer are performed at a temperature below 450° C. By keeping the temperature below this value, a diffusion of the applied first dopants and the applied second dopants is reduced, exemplarily a diffusion of first dopants implanted for forming the first semiconductor region and second dopants implanted for forming the second semiconductor region is reduced. Thus, the first and second semiconductor regions are better defined, which may be beneficial, in particular in low voltage devices comprising a thin wafer. Also a thickness required for the epitaxy steps may be reduced since less space is needed to separate the first and semiconductor regions from the second electrode layer and/or to separate the first and second semiconductor regions among themselves. This may reduce fabrication costs.

In an exemplary embodiment, the annealing step comprises: a first annealing step to activate the applied first dopants and a second annealing step to activate the applied second dopants. The first annealing step is performed before the step of forming the sixth semiconductor layer, and the second annealing step is performed before the step of forming the seventh semiconductor layer and after the first annealing step. The annealing may, for example, be performed by laser annealing. By performing two separate annealing steps, the first/second semiconductor region may exhibit a steeper doping concentration profile at an interface between the first/second semiconductor region and the surrounding second semiconductor layer, which may be beneficial, in particular for low voltage devices comprising a thin wafer.

Reference will now be made to the drawings.

FIG. 1A shows a vertical cross-section of a diode as an exemplary embodiment of a semiconductor device according to aspects of the invention. The diode comprises a semiconductor wafer 2 which has a first main side 21 and a second main side 22. The second main side 22 is opposite to the first main side 21. The first main side 21 and the second main side 22 extend in a horizontal direction and they are, for example, substantially parallel to each other. In a plan view, the semiconductor wafer 2 has, for example, a rectangular shape. However, embodiments are not limited to a rectangular shape, and it may also have a circular shape, an elliptical shape, a square shape or the like.

Herein, the term "vertical" is used to describe a direction perpendicular to the second main side 22, and the term "horizontal" is used to describe a direction perpendicular to the vertical direction. The terms "above" and "below" used herein, describe a relative location of a structural feature with respect to another structural feature taking into account the orientation defined by the first and second main sides 21, 22. Furthermore, a distance between two structures (e.g., regions or layers) refers to a minimal distance between the two structures; a thickness of a structure (e.g., region or layer) refers to a maximal thickness of the structure in a vertical direction; and a width of a structure (e.g., region or layer) refers to a maximal width of the structure in a horizontal direction.

The semiconductor wafer 2 is, for example, a silicon (Si) wafer. However, the presented inventive concepts can also be applied to other semiconductor wafers. Examples of further materials for such semiconductor wafers include, without restriction thereto, elemental semiconductor materials such as germanium (Ge), wide bandgap materials, compound semiconductor materials from group IV such as, for example, silicon carbide (SiC) or silicon-germanium (SiGe), binary, ternary or quaternary III-V semiconductor materials such as gallium arsenide (GaAs), gallium phosphide (GaP), indium phosphide (InP), indium gallium phosphide (InGaP) or indium gallium arsenide phosphide (InGaAsP) and binary or ternary II-VI semiconductor materials such as cadmium telluride (CdTe) and mercury cadmium telluride (HgCdTe), to name just a few.

On the first main side 21 of the semiconductor wafer 2 there is arranged a first electrode layer 11, and on the second main side 22 of the semiconductor wafer 2 there is arranged a second electrode layer 12. The first and second electrode layers 11, 12 are, for example, metallization layers composed of genuine metal (e.g., aluminum (Al), titanium (Ti), nickel (Ni), etc.), metal alloys (e.g., Al/Ti alloy, etc.) or materials having metallic electrical conductivity or virtually metallic electrical conductivity such as, for example tungsten silicide or highly doped polysilicon. The first electrode layer 11 forms, for example, an anode electrode of the diode, and the second electrode layer 12 forms, for example, a cathode electrode of the diode. The first and second electrode layers 11, 12 cover the entire first main side 21 and the entire second main side 22, respectively. But embodiments are not limited thereto. In other embodiments, the first and/or second electrode layers 11, 12 only cover a portion of the first and/or second main side 21, 22. In a plan view, the first and second electrode layers 11, 12 have, for example, a circular shape, an elliptical shape, a square shape or the like.

The semiconductor wafer 2 comprises, in an order from the first main side 21 to the second main side 22, a first semiconductor layer 3 of a first conductivity type and a second semiconductor layer 4 of a second conductivity type which is different from the first conductivity type (see FIG. 1A). The first semiconductor layer 3 forms a first pn junction 5 with the second semiconductor layer 4. The first semiconductor layer 3 is, for example, a p-doped silicon layer with p-type conductivity (e.g., doped with boron), and the second layer 4 is, for example, an n-doped silicon layer with n-type conductivity (e.g., doped with phosphor). The first semiconductor layer 3 is in electric contact with the first electrode layer 11, for example in ohmic contact, and may function as a p-type emitter. The second semiconductor layer 4 is in electric contact with the second electrode layer 12, for example in ohmic contact, and may function as an n-type emitter. An ohmic contact is characterized by a symmetrical linear current-voltage curve and may, for example, be obtained by choosing a doping concentration of the semiconductor wafer 2 at the contact region to the first and second electrode layers 11, 12 sufficiently high.

Figure 1B:
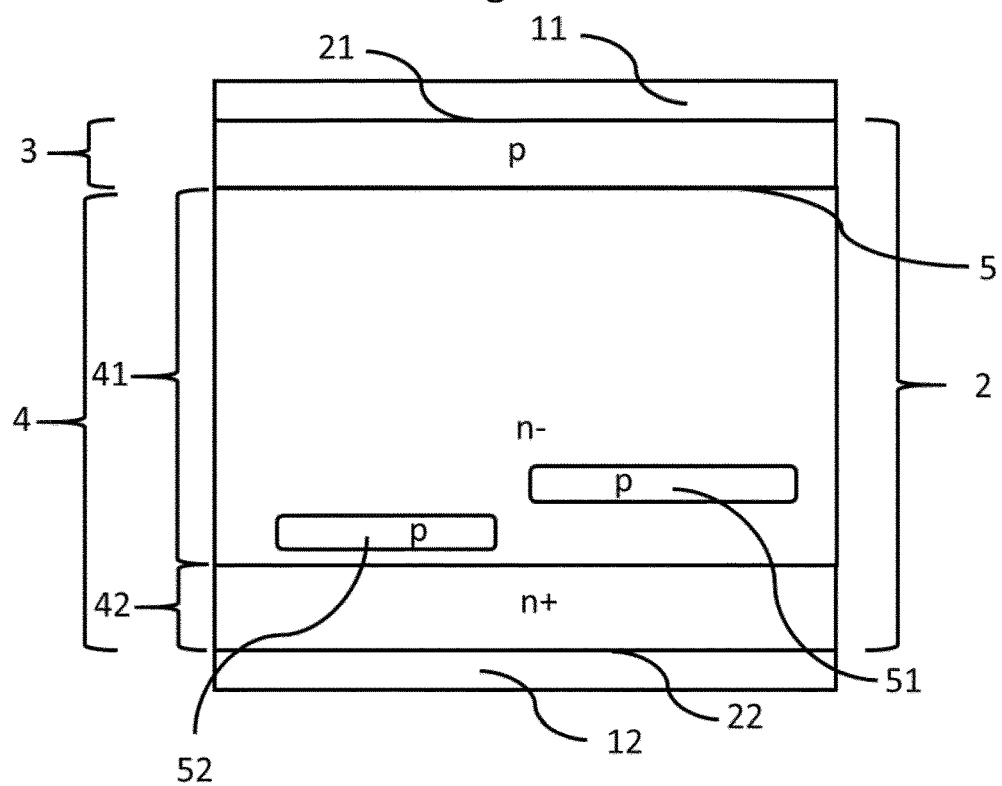
FIG. 1B shows a schematic vertical cross-sectional view of a PIN diode according to an exemplary embodiment depicting aspects of the invention.

Referring to FIG. 1B, according to an exemplary embodiment depicting aspects of the invention, the second semiconductor layer 4 comprises a third semiconductor layer 41 of the second conductivity type (e.g., an n⁻-doped base layer/drift layer) which forms the first pn junction 5 with the first semiconductor layer 3, and a fourth semiconductor layer 42 of the second conductivity type (e.g., an n⁺-type emitter layer) which forms said ohmic contact with the second electrode layer 12. The fourth semiconductor layer 42 has a maximal doping concentration which is at least one order of magnitude higher than a maximal doping concentration of the third semiconductor layer 41. The third semiconductor layer 41 is electrically connected to the second electrode layer 22 via the fourth semiconductor layer 42.

Figure 1C:
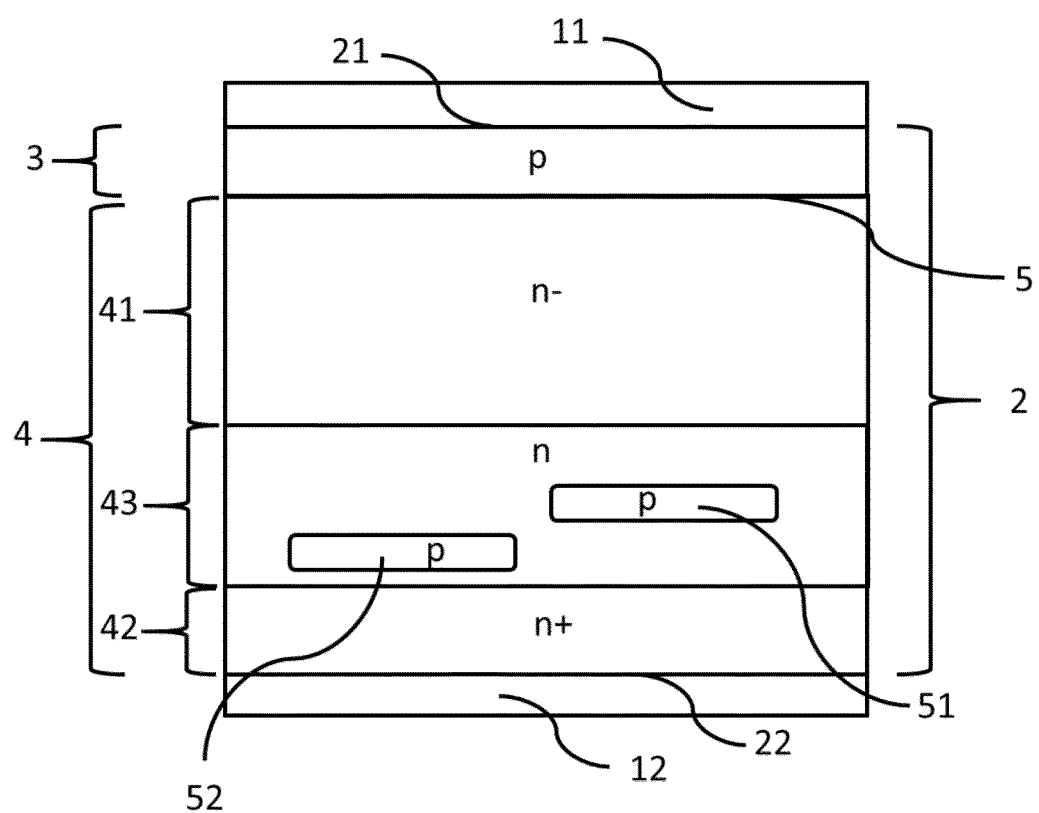
FIG. 1C shows a schematic vertical cross-sectional view of PIN diode according to an exemplary embodiment of the invention.

Referring to FIG. 1C, according to an exemplary embodiment of the invention, the second semiconductor layer 4 further comprises a fifth semiconductor layer 43 of the second conductivity type (e.g., a n-type buffer layer) between the third semiconductor layer 41 and the fourth semiconductor layer 42. The fifth semiconductor layer 43 has a maximal doping concentration that is lower than the maximal doping concentration of the fourth semiconductor layer 42 and higher than the maximal doping concentration of the third semiconductor layer 41. The third semiconductor layer 41 is electrically connected to the second electrode layer 22 via the fifth semiconductor layer 43 and the fourth semiconductor layer 42.

Herein, relative doping concentrations are indicated by "−" or "+" symbols being appended to the doping type (n or p). By way of example, an n⁻-type region denotes a maximal doping concentration that is less than a maximal doping concentration of an n-type region, while an n⁺-type region has a higher maximal doping concentration than that of the n-type region. However, the indication of the relative doping concentration does not mean that doping regions of the same relative doping concentration have the same absolute doping concentration, unless mentioned the contrary. By way of example, two different n-type regions (or n⁻-type regions or n⁺-type regions) can have different absolute doping concentrations. The same also applies, for a p-type region (or p⁻-type regions or p⁺-type regions). Moreover, when reference is made to a region, layer etc. having a doping concentration of a specific conductivity type, then it is meant the net doping concentration of this specific conductivity type, i.e., a difference between the dopant concentration of the specific conductivity type minus the dopant concentration of the opposite conductivity type.

A maximal doping concentration of the second semiconductor layer 4 is, for example, in the range from $3 \times 10^{12}$ cm$^{-3}$ to $1 \times 10^{21}$ cm$^{-3}$. A maximal doping concentration of the third semiconductor layer 41 is, for example, in a range from $3 \times 10^{12}$ cm$^{-3}$ to $3 \times 10^{14}$ cm$^{-3}$. A maximal doping concentration of the fourth semiconductor layer 42 is, for example, in a range from $1\times10^{16}$ cm$^{-3}$ to $1\times10^{21}$ cm$^{-3}$, and a maximal doping concentration of the fifth semiconductor layer 43 is, for example, in a range from $1\times10^{15}$ cm$^{-3}$ to $1\times10^{18}$ cm$^{-3}$. A maximal doping concentration of the first semiconductor layer 3 is, for example, in a range from $1\times10^{16}$ cm$^{-3}$ to $1\times10^{20}$ cm$^{-3}$.

A thickness of the first semiconductor layer 3 is, for example, in a range from 2 μm to 40 μm. A thickness of the second semiconductor layer 4 is, for example, in a range from 50 μm to 1050 μm. A thickness of the third semiconductor layer 41 is, for example, in a range from 40 μm to 1040 μm. A thickness of the fourth semiconductor layer 42 is, for example, in a range from 500 nm to 10 μm. A thickness of the fifth semiconductor layer 43 is, for example, in a range from 5 μm to 20 μm.

The semiconductor wafer 2 further comprises a plurality of semiconductor regions of the first conductivity type (e.g., p-type conductivity) including at least a first semiconductor region 51 and a second semiconductor region 52. The first and the second semiconductor regions 51, 52 are completely embedded in the second semiconductor layer 4. This means that the first and second semiconductor regions 51, 52 are not in direct contact with the first and second electrode layers 11, 12 and not in direct contact with the first semiconductor layer 2. The first and second semiconductor regions 51, 52 are floating p-type regions buried into the second semiconductor layer 4 (see FIG. 1A). The first semiconductor region 51 forms a second pn junction with the second semiconductor layer 4, and the second semiconductor region 52 forms a third pn junction with the second semiconductor layer 4. In an exemplary embodiment, the first and second semiconductor regions 51, 52 are, for example, embedded in the third semiconductor layer 41 (see FIG. 1B) or are, for example, embedded in the fifth semiconductor layer 43 (see FIG. 1C). In a plan view, the first and second semiconductor regions 51, 52 have, for example, a circular shape, an elliptical shape, a rectangular shape, a square shape, or the like.

Figure 2A:
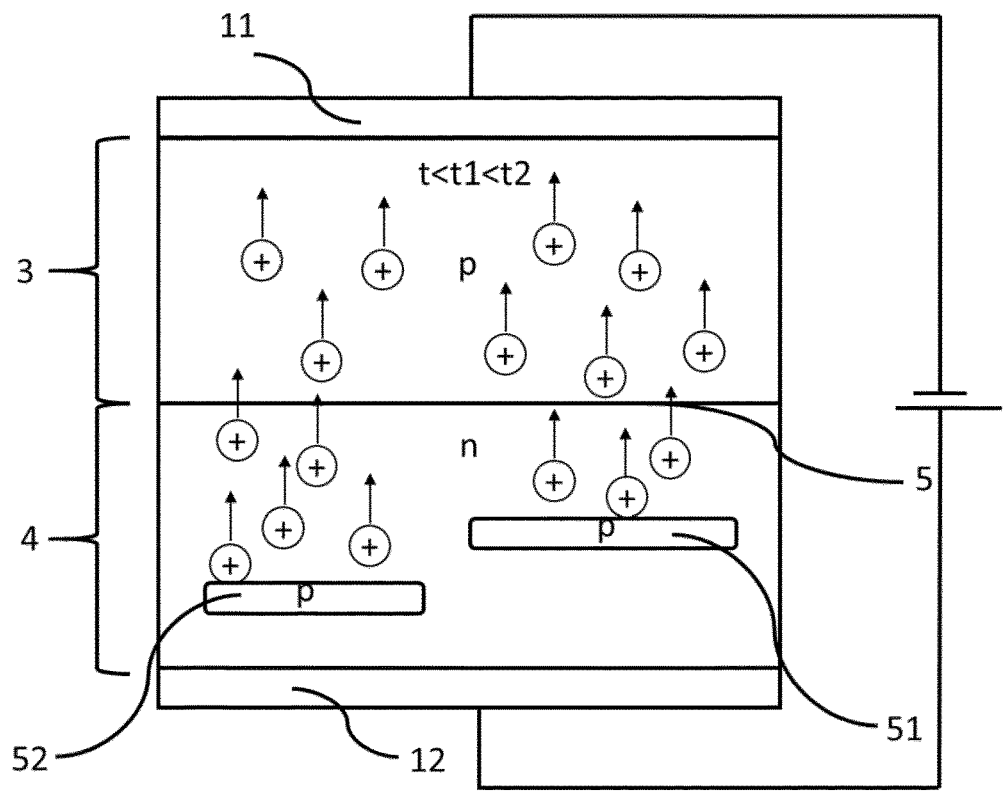
FIG. 2A shows a schematic vertical cross-sectional view of a diode according to an exemplary embodiment depicting aspects of the invention at a first time point during reverse recovery, in which both the first and second semiconductor regions inject holes.
Figure 2B:
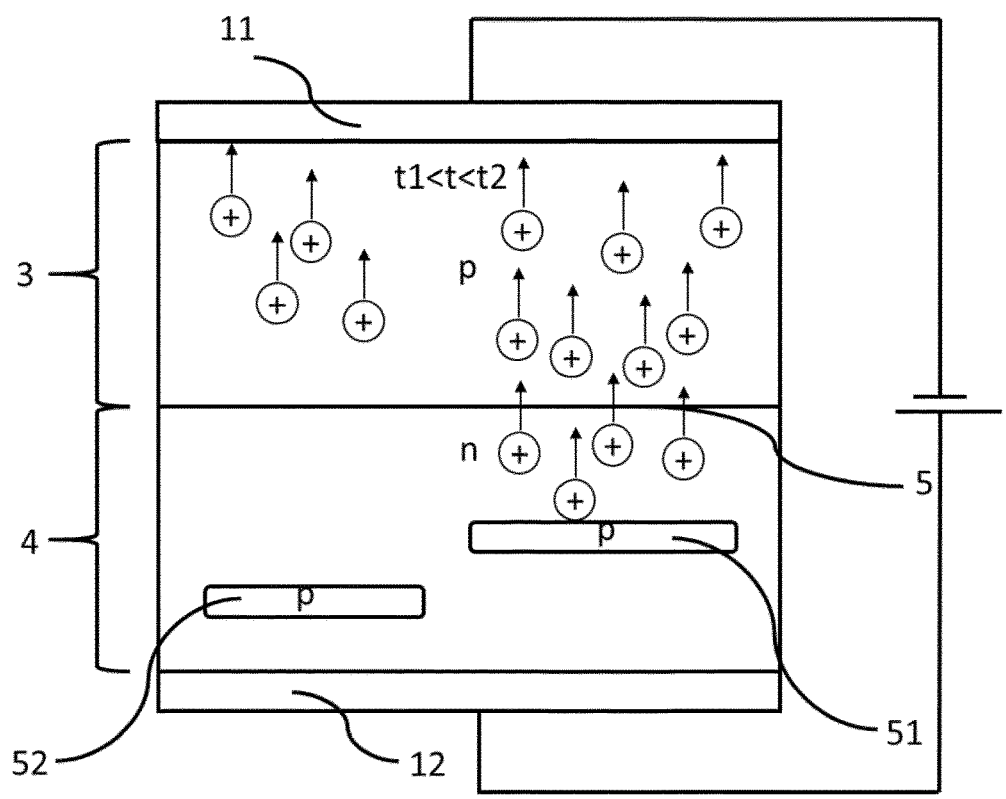
FIG. 2B shows a schematic vertical cross-sectional view of a diode according to an exemplary embodiment depicting aspects of the invention at a second time point during reverse recovery, in which the second semiconductor region has stopped injecting holes.
Figure 2C:
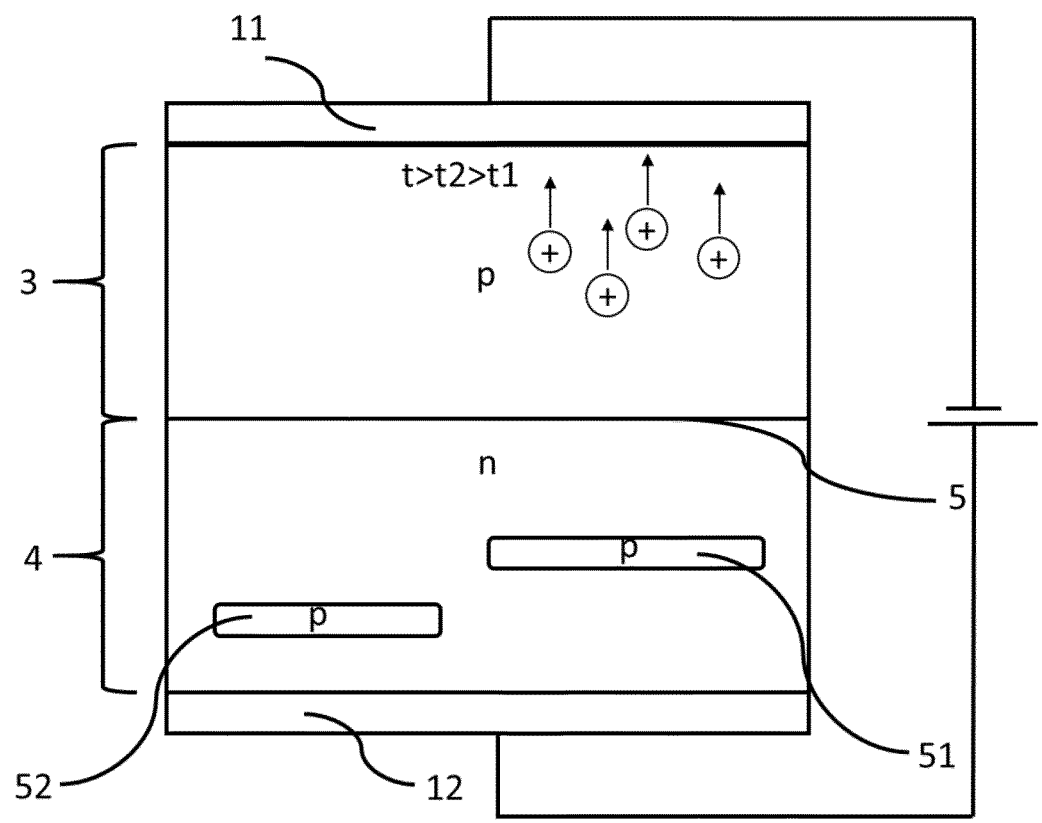
FIG. 2C shows a schematic vertical cross-sectional view of a diode according to an exemplary embodiment depicting aspects of the invention at a third time point during reverse recovery, in which the first and second semiconductor regions have stopped injecting holes.

The first semiconductor region 51 and the second semiconductor region 52 are configured to stop injecting charge carriers of the first conductivity type (e.g., holes) into the second semiconductor layer 4 at different time points during reverse recovery. In other words, the first semiconductor region 51 and the second semiconductor region 52 have different first conductivity type charge carrier injection durations during inverse recovery. Thus, a decrease of free charge carriers during reverse recovery is smoother and more gradual than in a device according to the prior art. For example, the first semiconductor region 51 is configured such that it injects holes during reverse recovery until a first time point t1, and the second semiconductor region 52 is configured such that it injects holes during reverse recovery until a second time point t2 which is earlier than the first time point t1, i.e., t2<t1. This is exemplarily illustrated in FIGS. 2A-2C. For reasons of clarity, only holes injected by the first and second semiconductor regions 51, 52 are illustrated. When a reverse voltage is applied between the first and second electrode layers 11, 12 (anode electrode and cathode electrode) and the reverse recovery is initiated, the first and second semiconductor regions 51, 52 inject holes into the second semiconductor layer 4. The injected holes are attracted towards the negatively biased anode electrode ii. A time point t during reverse recovery which is earlier than t1 and t2 is shown in FIG. 2A. FIG. 2B shows a time point t during reverse recovery which is later than t2 but earlier than t1. At this time point the second semiconductor region 52 has stopped injecting holes whereas the first semiconductor region 51 is still injecting holes into the second semiconductor layer 4. FIG. 2C shows a time point t during reverse recovery which is later than t1 and t2. At this time point the first and the second semiconductor region 52 have both stopped injecting holes.

The first semiconductor region 51 and the second semiconductor region 52 are considered to have stopped injecting charge carriers of the first conductivity type, when a value of an injection rate (amount of charge carriers of the first conductivity type injected per unit time) has reached (or dropped below) a threshold value, for example a threshold value which is determined by an equilibrium condition under reverse bias. Such threshold value is, for example, the value (or 1.1 times the value or 1.5 times the value) of the injection rate in a time point when the reverse current reaches its equilibrium value. An equilibrium condition is considered to be reached, when waiting an appropriate amount of time, for example 1 ms or more, after having switched to reverse bias.

A value of a time difference Δt between the first time point t1 and the second time point t2 (i.e., Δt=t1−t2) depends on the device rating and application. It is, however, larger than a time difference obtained due to normal process variability. A value of a time difference Δt is, for example, larger than 1 ns or larger than 2 ns.

A first way to configure the first and second semiconductor regions 51, 52 such that they stop injecting charge carriers of the first conductivity type (e.g., holes) into the second semiconductor layer 4 at different time points t1, t2 during reverse recovery, is to position them at different distances from the second main side 22. For example, the first semiconductor region 51 can be positioned further at a first distance d21 from the second main side 22 and the second semiconductor region 52 can be positioned closer at a second distance d22 to the second main side 22, i.e., d21>d22. Typically, the further a semiconductor region is positioned away from the second main side 22, the later is a time point at which it stops injecting charge carriers of the first conductivity type during reverse recovery and thus the longer is its first conductivity type charge carrier injection duration during reverse recovery. A value of the first distance d21 from the second main side 22 and a value of the second distance d22 from the second main side 22 depend on the device rating and application. A required difference between d21 and d22 (i.e., Δd=d21−d22) is, however, larger than what is obtained by normal process variability, and is, for example, larger than 1 μm.

An exemplary embodiment of the first way is depicted in FIG. 1A. The first semiconductor region 51 and the second semiconductor region 52 are positioned at different distances d21, d22 from the second main side 22, e.g., d21>d22, they may be positioned closer to the second main side 22 than to the first pn junction 5 (see FIG. 113), they have a same thickness (th51=th52), a same width (w51=w52) and a same maximal doping concentration (c51=c52). Here and in the following, when two elements are considered to have a same property, then it is understood that this property is the same within a process variability. A thickness of the first and second semiconductor regions 51, 52 (i.e., th51, th52) is, for example, in a range between 200 nm and 5 μm or in a range between 1 μm and 4 μm. A distance at which the first and second semiconductor regions 51, 52 are positioned from the second main side 22 (i.e., d21, d22) is, for example, in a range from 1 μm to 50 μm or 15 μm to 30 μm. A width of the first and second semiconductor regions 51, 52 (i.e., w51, w52) is, for example, in a range from 5 μm to 300 μm, or 50

μm to 200 μm. A maximal doping concentration of the first and second semiconductor regions 51, 52 (i.e., c51, c52) is, for example, in a range from $1 \times 10^{13}$ cm$^{-3}$ to $1 \times 10^{16}$ cm$^{-3}$ depending on the amount of charge needed for softness. The distance of the first and second semiconductor regions 51, 52 from the first pn junction depends on the voltage rating of the device, and as a consequence on the thickness of the second semiconductor layer 4. On a first approximation, increasing the voltage rating will mostly increase the thickness of the second semiconductor layer 4, whilst d21 and d22 will remain constant. Therefore, in a high voltage device (e.g., 10 kV, 1050 μm thickness) the first and second semiconductor regions 51, 52 will be much closer to the second main side 22 than to the first pn junction 5, while in a very low voltage device (50 μm total thickness) the difference in distance will be much lower.

Moreover, a third distance d11 of the first semiconductor region 51 from the first main side 21 is smaller than a fourth distance d1e of the second semiconductor region 52 from the first main side 21, i.e., d11<d12. The first and the second semiconductor regions 51, 52 are mutually separated (i.e., they are not in direct contact with each other). The first and second semiconductor regions 51, 52 do not overlap with each other in an orthogonal projection onto a plane parallel to the second main side 22 and also do not overlap in an orthogonal projection onto any plane perpendicular to the second main side 22.

A second way to configure the first and second semiconductor regions 51, 52 such that they stop injecting charge carriers of the first conductivity type (e.g., holes) into the second semiconductor layer 4 at different time points during reverse recovery, is to form the first and second semiconductor regions 51, 52 such that they have a different thickness. The thicker a semiconductor region, the longer it typically injects charge carriers during reverse recovery and thus the longer is its first conductivity type charge carrier injection duration during reverse recovery. A required difference in thickness (i.e., Δth=th51−th52) depends on the device rating and application. It is, however, larger than what is obtained by normal process variability, and is, for example, larger than 200 nm or larger than 1 μm.

Figure 3A:
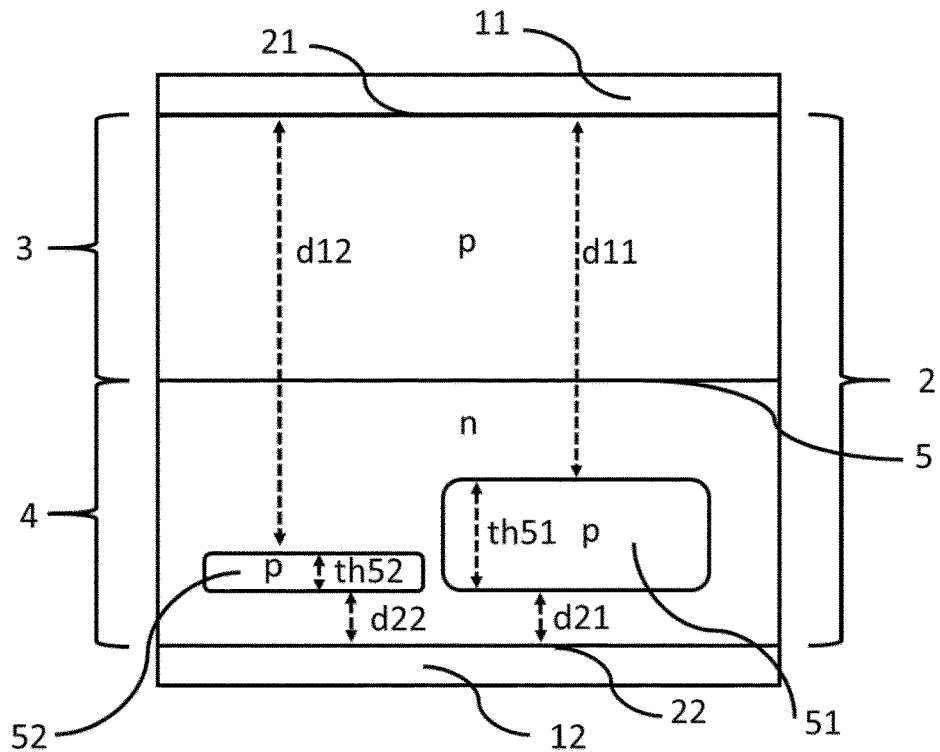
FIG. 3A shows a schematic vertical cross-sectional view of a diode according to an exemplary embodiment depicting aspects of the invention.

An exemplary embodiment of the second way is depicted in FIG. 3A. The first semiconductor region 51 is thicker (thickness th51) than the second semiconductor region 52 (thickness th52), i.e., th51>th52. The first and second semiconductor regions 51, 52 have a same maximal doping concentration, a same width and a same distance d21, d22 from the second main side 22 (i.e., d21=d22). Specific values are as described above. The third distance d11 of the first semiconductor region 51 to the first main side 21 is smaller than the fourth distance d12 of the second semiconductor region 52 to the first main side 22 (i.e., d11<d12). The first and second semiconductor regions 51, 52 do not overlap with each other in an orthogonal projection onto a plane parallel to the second main side 22 but overlap in an orthogonal projection onto a plane perpendicular to the second main side 22.

A third way to configure the first and second semiconductor regions 51, 52 such that they stop injecting charge carriers of the first conductivity type (e.g., holes) into the second semiconductor layer 4 at different time points during reverse recovery, is to form the first and second semiconductor regions 51, 52 such that they have different maximal doping concentrations. The higher the maximal doping concentration of a semiconductor region, the longer it typically injects charge carriers during reverse recovery and thus the longer is its first conductivity type charge carrier injection duration during reverse recovery. A required difference in maximal doping concentration (i.e., Δc=c51−c52) depends on the device rating and application. It is, however, larger than what is obtained by normal process variability, and is, for example, larger than 5% or larger than 10%.

Figure 3B:
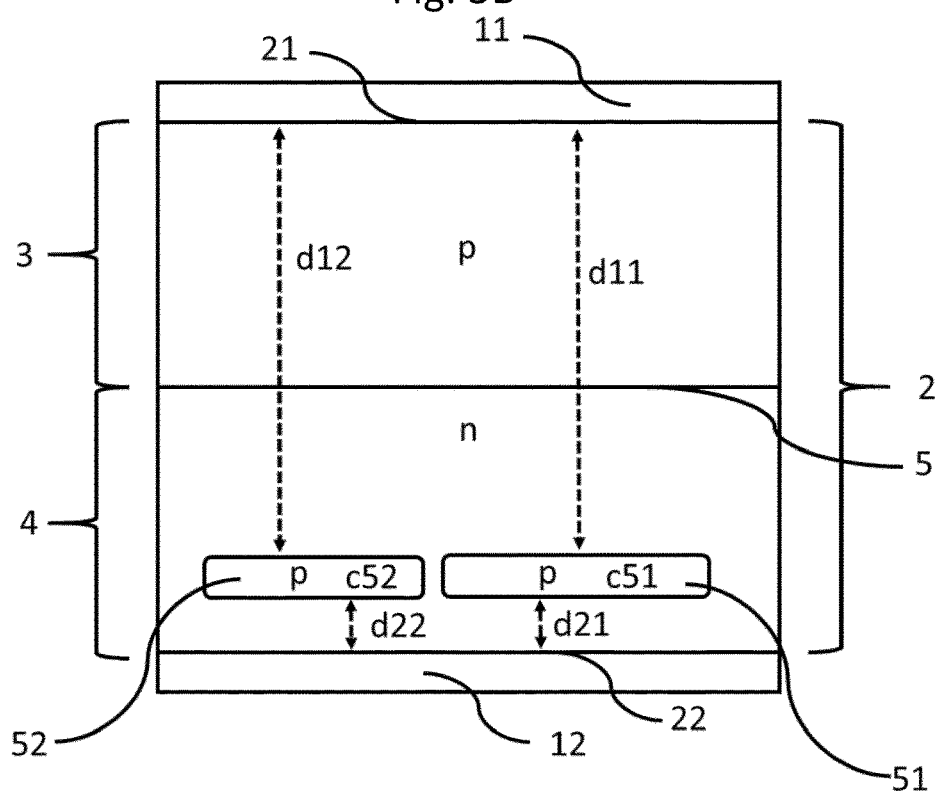
FIG. 3B shows a schematic vertical cross-sectional view of a diode according to an exemplary embodiment depicting aspects of the invention.

An exemplary embodiment of the third way is depicted in FIG. 3B. The first semiconductor region 51 has a higher maximal doping concentration (concentration c51) than the second semiconductor region 52 (concentration c52), i.e., c51>c52. The first and second semiconductor regions 51, 52 have a same thickness, a same distance to the first and second main sides 21, 22, respectively. Specific values are as described above. The first and second semiconductor regions 51, 52 do not overlap with each other in an orthogonal projection onto a plane parallel to the second main side 22 but overlap in an orthogonal projection onto a plane perpendicular to the second main side 22.

These three different approaches can be combined or used individually. However, when combining these approaches, care should be taken to avoid that their effects cancel each other.

To avoid such cancelation, a semiconductor region which is further from the second main side 22 (i.e., the first semiconductor region 51 in the presented embodiments) should have a same or a higher maximal doping concentration than a semiconductor region which is closer to the second main side 22 (i.e., the second semiconductor region 52 in the presented embodiments), i.e., c51≥c52, a same or greater thickness, i.e., th51≥th52, and a same or greater width, i.e., w51≥w52. In a case where the first and second semiconductor regions 51, 52 have a same distance from the second main side 22, i.e., d21=d22, then the semiconductor region with the higher maximal doping concentration (i.e., the first semiconductor region 51 in the presented embodiments) should have a same or higher thickness than the semiconductor region with the lower maximal doping concentration (i.e., the second semiconductor region 52 in the presented embodiments), i.e., th51≥th52, and a same or greater width, i.e., w51≥w52.

However, this does not mean that other combinations having the described technical effect are excluded.

Figure 3C:
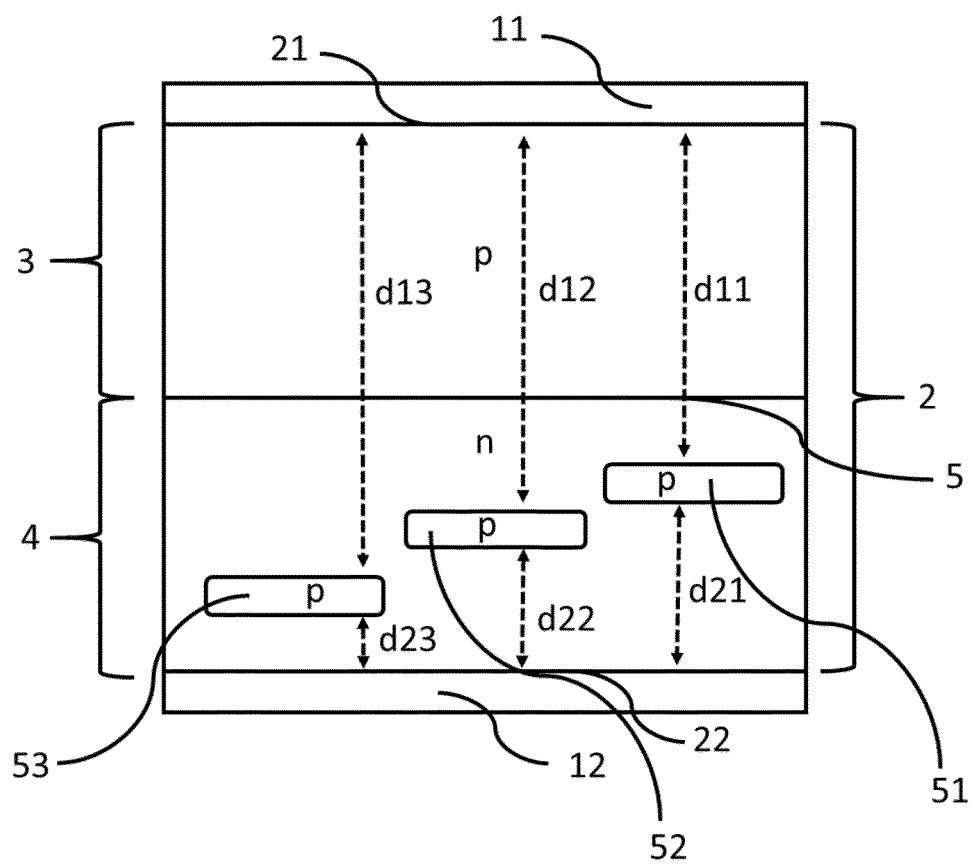
FIG. 3C shows a schematic vertical cross-sectional view of a diode according to an exemplary embodiment depicting aspects of the invention.

Referring to FIG. 3C depicting aspects of the invention, the plurality of semiconductor regions of the first conductivity type includes a third semiconductor region 53 of the first conductivity type. The third semiconductor region 53 is positioned at a fifth distance d23 from the second main side 22 and at a sixth distance d13 from the first main side 21. The fifth distance d23 differs from the first distance d21 and the second distance d22. The sixth distance d13 differs from the third distance d11 and the fourth distance d12. The above described principles apply mutatis mutandis.

Figure 4A:
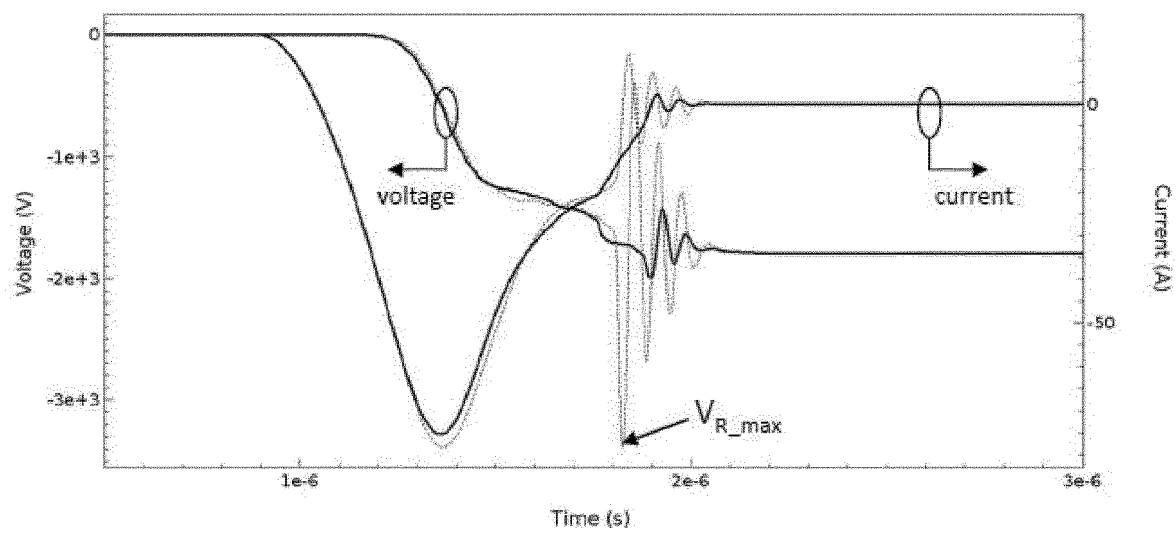
FIG. 4A shows a voltage and a current curve of a diode according to an exemplary embodiment of the invention and a current voltage and voltage curve of a reference diode known in the art.
Figure 4B:
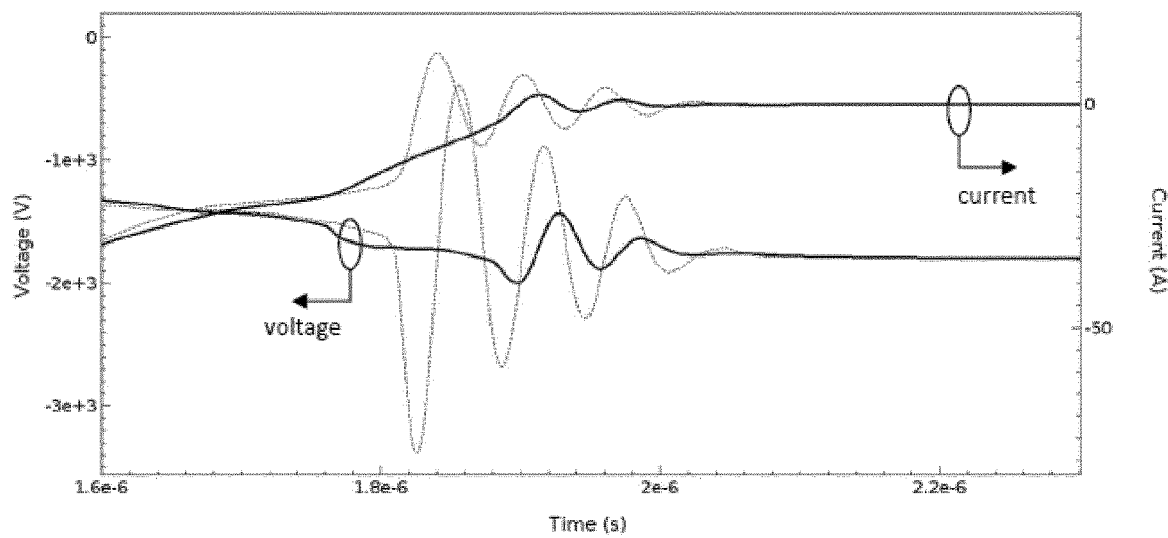
FIG. 4B shows an enlarged view of the voltage and current curves of FIG. 4A.
Figure 5A:
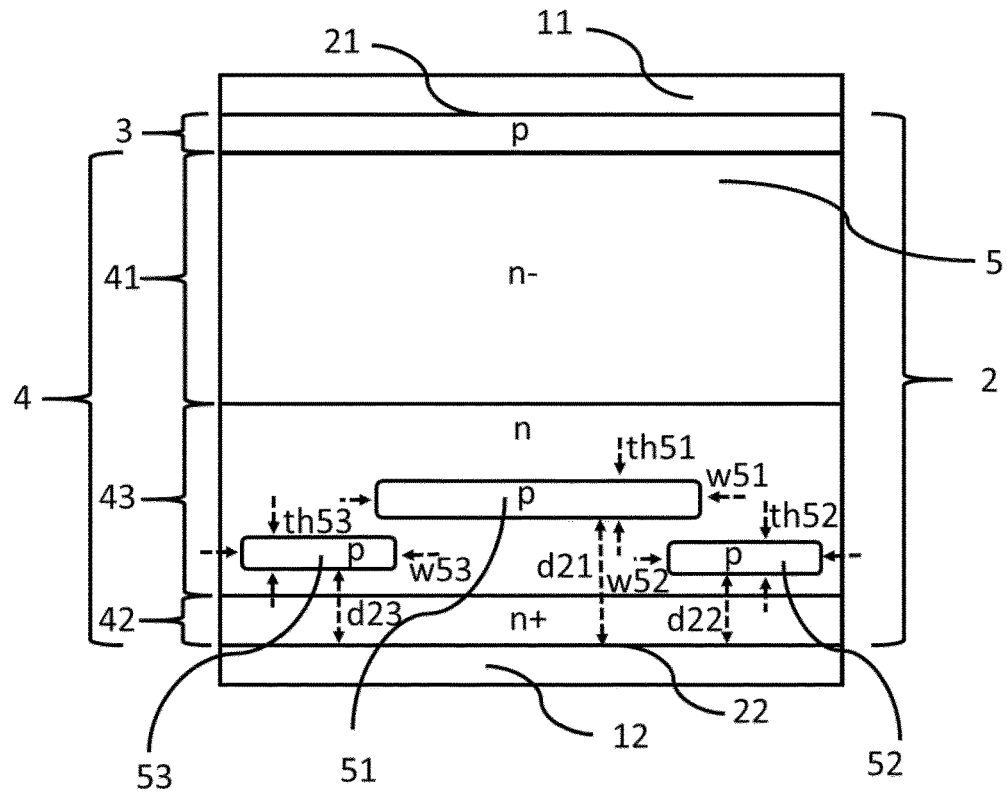
FIG. 5A shows a schematic vertical cross-sectional view of a diode according to an exemplary embodiment of the invention.

FIG. 4A depicts a simulated current and voltage as a function of time during reverse recovery in a 3.3 kV diode according to the invention and in a reference diode. FIG. 4B depicts a detailed view thereof. A vertical cross-section of the simulated diode according to the invention is depicted in FIG. 5A. The reference diode has the same structure, except that it does not comprise the plurality of semiconductor regions 51, 52, 53. The diode according to the invention comprises a first semiconductor region 51 of p-type conductivity positioned at a distance d21=21 μm from the second main side 22, and second and third semiconductor regions 52, 53 of p-type conductivity positioned at a distance d23=d22=15 μm from the second main side 22. A thickness of each of the first to third semiconductor regions 51, 52, 53 is 2 μm, and a width of the first semiconductor region is 150 μm and a width of the second and third semiconductor regions 52, 53 is 100 µm. In in an orthogonal projection onto a plane parallel to the second main side 22, the first semiconductor region 51 overlaps with each of the second and third semiconductor regions 52, 53 by 50 µm in a horizontal direction. Each of the first to third regions 51, 52, 53 have the same doping concentration of $3\times10^{15}$ cm$^{-3}$. Further simulation parameters are depicted in Table 1.

TABLE 1

Simulation parameters

| | |
|---|---|
| ON state current $I_F$ | 15 A |
| Bias voltage $V_{DC}$ | 1800 V |
| Gate resistance $R_G$ | 33 Ω |
| Inductive load $L_\sigma$ | 1200 nH |
| Temperature | 300 K |

As it is evident from FIGS. 4A and B, in the diode according to the invention, the current and voltage oscillations are greatly dampened resulting in a much lower voltage overshoot ($V_{R\_max}$=−1996 V vs. $V_{R\_max}$=−3383 V) compared to the reference diode.

Further simulation results comparing exemplary diodes according to the invention with the abovementioned reference diode, a FCE diode and a CIBH diode are summarized in Table 2. In all diodes, the p-type semiconductor regions have the same doping concentration ($3\times10^{15}$ cm$^{-3}$). Moreover, all the designs share the same ratio between total area of p-type semiconductor regions and total area of the semiconductor wafer 2. In this way it is ensured that the improvements of the present invention is not merely due to an increased area of p-type semiconductor regions, but to their specific placement and specifically their staggered distance form the second main side 22.

TABLE 2

Summary of the simulation results.

Figure 5B:
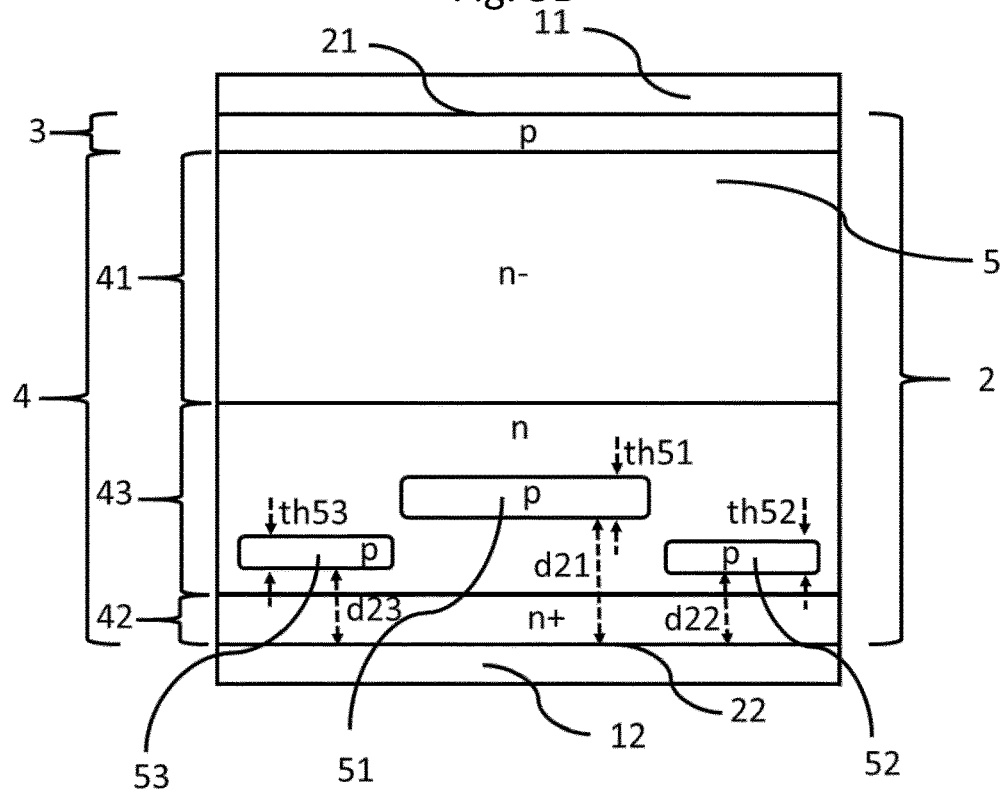
FIG. 5B shows a schematic vertical cross-sectional view of a diode according to an exemplary embodiment of the invention.

| | $V_{R\_max}$ | $V_f$ | $V_b$ | $E_{rec}$ |
|---|---|---|---|---|
| Reference diode no p-type region in second semiconductor layer | −3383 V | 1.799 V | 5090 V | 24.29 mJ |
| CIBH diode 10 equal p-type regions, equally spaced in horizontal direction, 35 µm wide, 2 µm thick, 1.5 µm from second main side | −3027 V | 1.980 V | 5052 V | 18.95 mJ |
| FCE diode | −3017 V | 2.004 V | 5052 V | 18.77 mJ |
| Diode according to invention as shown in FIG. 5B d21 = 21 µm, d22 = d23 = 15 µm, th51 = th52 = th53 = 3 µm, w52 = w53 = 82.5 µm, w51 = 177 µm | −1897 V | 1.800 V | 4892 V | 24.30 mJ |
| Diode according to invention as shown in FIG. 5A d21 = 21 µm, d22 = d23 = 15 µm, th51 = th52 = th53 = 2 µm, w52 = w53 = 100 µm, w51 = 150 µm | −1997 V | 1.800 V | 4978 V | 24.36 mJ |
| Diode according to invention as shown in FIG. 5A (with overlap), d21 = 1.5 µm, d22 = d23 = 7.5 µm, th51 = th52 = th53 = 2 µm, w52 = w53 = 100 µm, w51 = 150 µm | −2910 V | 1.887 V | 5078 V | 21.53 mJ |

Table 2 shows that a diode according to the invention, compared to the reference diode, has significantly less voltage overshoot (lower $V_{R\_max}$), while essentially maintaining the blocking voltage $V_b$, the forward conduction loss (forward voltage drop $V_f$) and the reverse recovery energy ($E_{rec}$). Compared to the CIBH diode or the FCE diode, a diode according to the invention has significantly less voltage overshoot (smaller $V_{R\_max}$) and less forward conduction loss (lower forward voltage drop $V_f$). In a configuration in which the semiconductor regions do not overlap with each other in an orthogonal projection onto a plane parallel to the second main side (e.g., FIG. 5B), a voltage overshoot is even further reduced. In contrast, a configuration in which the semiconductor regions overlap in an orthogonal projection onto a plane parallel to the second main side (e.g., FIG. 5A), the blocking voltage (Vb) is increased. In the case where the p-type semiconductor regions 51, 52, 53 are at a shorter distance from the second main side 22 (e.g., the case where d21=1.5 µm, d22=d23=7.5 µm), the improvements in terms of softness are not as good as in the structures with the p-type semiconductor regions 51, 52, 53 at a longer distance (e.g., the case where d21=21 µm, d22=d23=15 µm), but there is still an improvement compared to the prior art. Further, such a structure may be advantageous in view of manufacturing costs.

FIGS. 6A to 6I illustrate in a vertical cross-sectional view, steps of a method for manufacturing a PIN diode according an exemplary embodiment as shown in FIG. 1B.

Figure 6A:
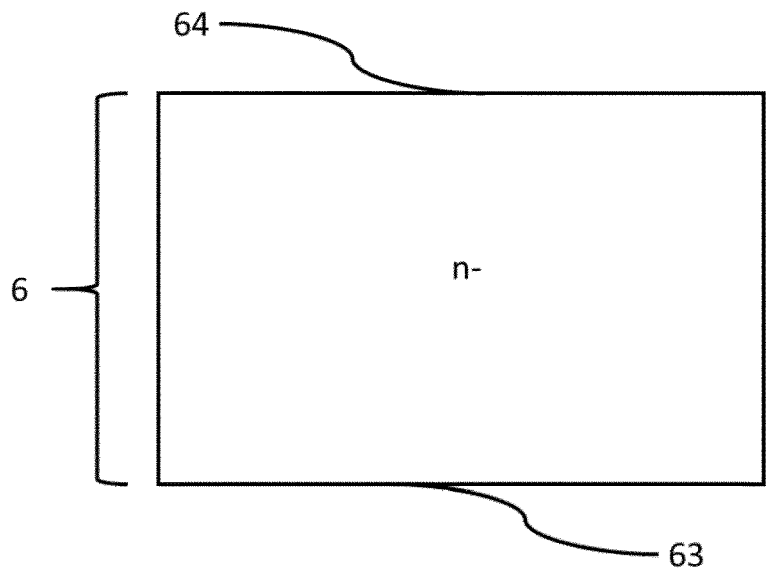
FIGS. 6A to 6I show schematic vertical cross-sectional views of methods steps for manufacturing a semiconductor device according to an exemplary embodiment of the invention.

In a first method step, as shown in FIG. 6A, it is provided a semiconductor substrate 6 of the second conductivity type (e.g., n-type) having a third main side 63 and a fourth main side 64 opposite to the third main side 63. A maximal doping concentration of the semiconductor substrate 6 is, for example, the same as a maximal doping concentration of the third semiconductor layer 41. The semiconductor substrate 6 is, for example, a weakly doped n⁻-type substrate. The semiconductor substrate 6 can be a monocrystalline substrate. However, it is also possible for the semiconductor substrate 6 to contain a monocrystalline base substrate and at least one epitaxial layer formed thereon. The third main side 63 becomes, for example, the first main side 21 of the final device.

Figure 6B:
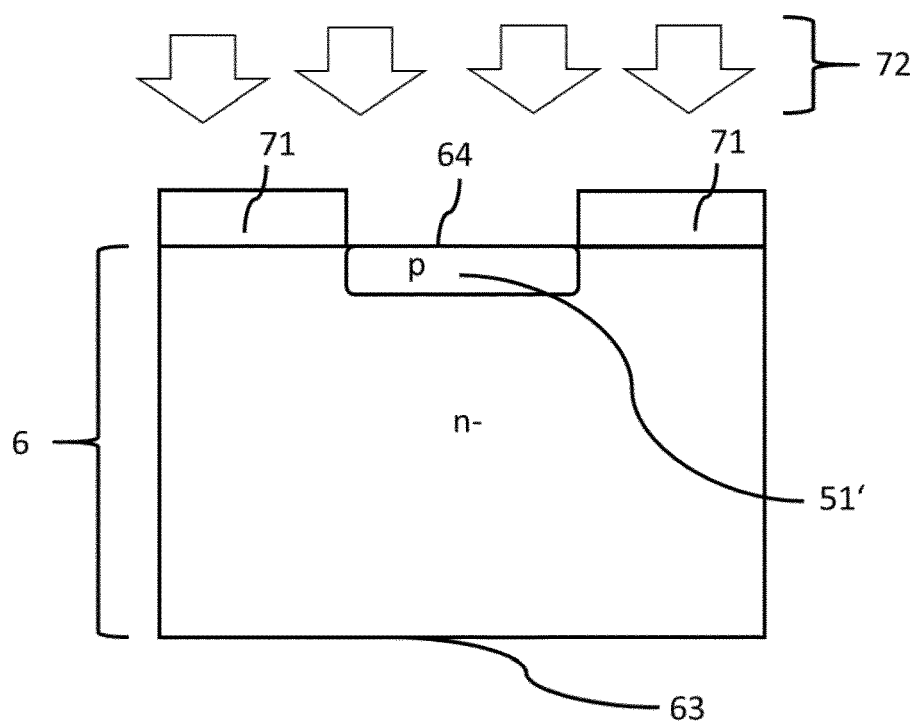

In a second method step, as shown in FIG. 6B, first dopants 72 of the first conductivity type (e.g., boron ions) are implanted at the fourth main side 64 into a first region 51' of the semiconductor substrate 6. The implantation may be performed through a patterned mask 71 that exposes a portion of the fourth main side 64 below which the first semiconductor region 51 of the final device is to be formed and that covers another portion of the fourth main side 64 below which the first semiconductor region 51 of the final device is not to be formed. The patterned mask 71 is, for example, formed by photolithographic means.

Figure 6C:
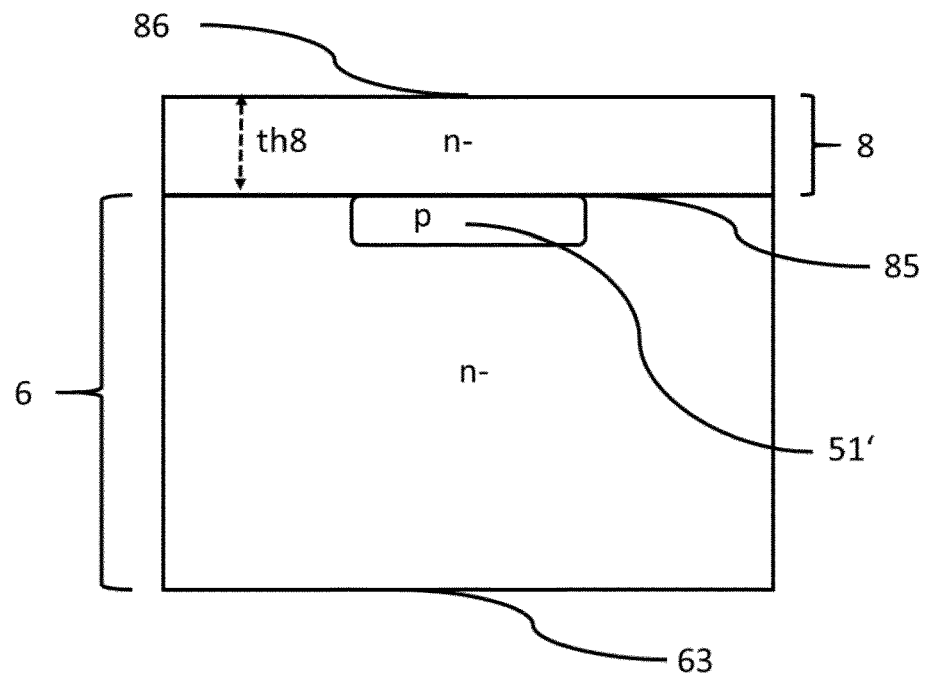

Thereafter, the patterned mask 71 is removed from the fourth main side 64 and a sixth semiconductor layer 8 of the second conductivity type is formed on the fourth main side 64, as shown in FIG. 6C. The sixth semiconductor layer 8 has a fifth main side 85 which coincides with the fourth main side 64 of the semiconductor substrate 6 and a sixth main side 86 opposite to the fifth main side 85. The sixth semiconductor layer 8 is, for example, formed by epitaxy (e.g., epitaxial growth of silicon). A maximal doping concentration of the sixth semiconductor layer 8 is, for example, the same as (or comparable to) a maximal doping concentration of the semiconductor substrate 6. The sixth semiconductor layer 8 is doped by incorporating ions of the second conductivity type 75 (e.g., phosphorous ions) into the epitaxial grown layer during the epitaxial process, or alternatively after the epitaxial process by ion implantation.

Figure 6D:
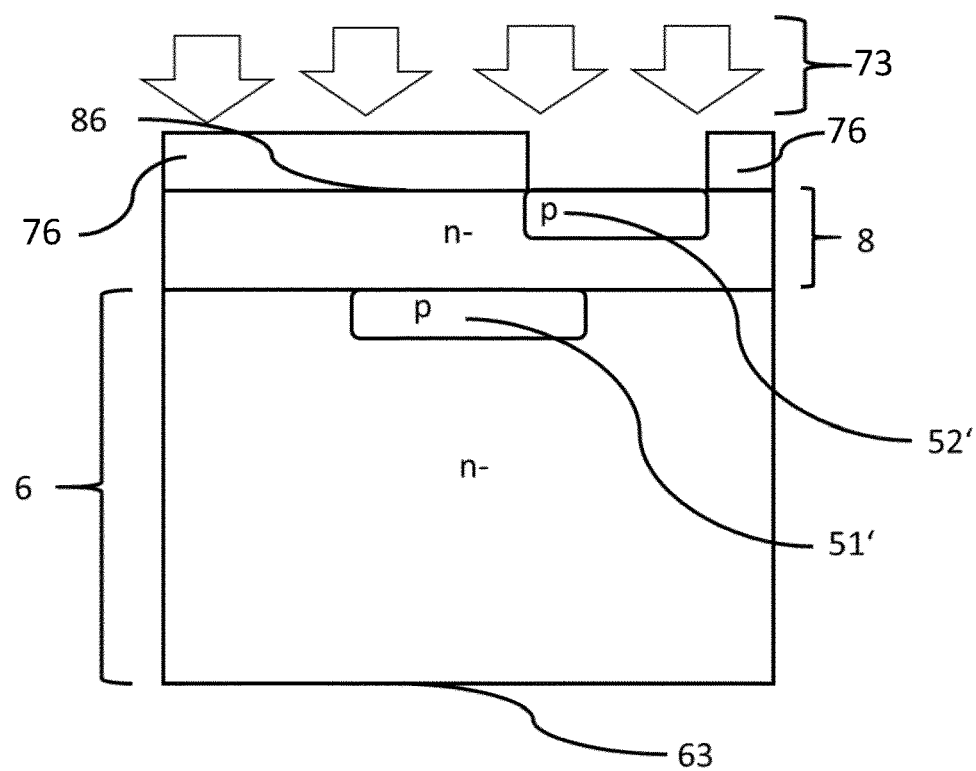

In a further method step shown in FIG. 6D and comparable to the method step described with respect to FIG. 6B, second dopants 73 of the first conductivity type are implanted at the sixth main side 86 into a second region 52' of the sixth semiconductor layer 8 through a patterned mask 76. The patterned mask 76 exposes a portion of the sixth main side 86 below which the second semiconductor region 52 is to be formed in the final device.

Figure 6E:
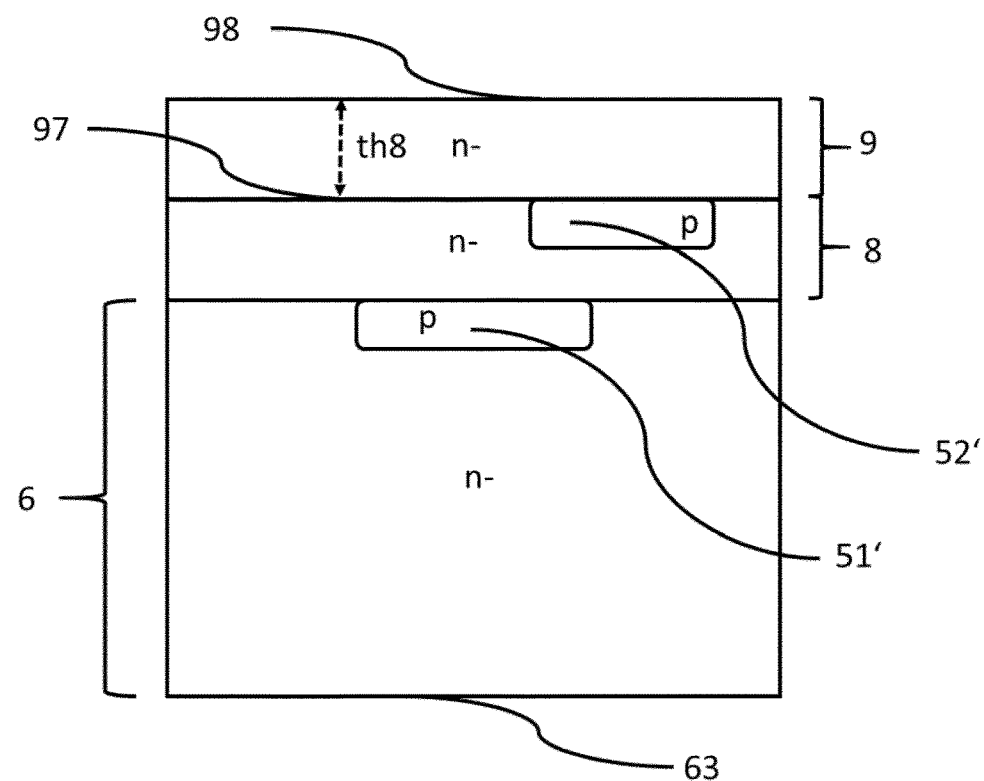

Thereafter, the patterned mask 76 is removed from the sixth main side 86 and a seventh semiconductor layer 9 of the second conductivity type is formed on the sixth main side 86, as shown in FIG. 6E. The seventh semiconductor layer 9 has a seventh main side 97 which coincides with the sixth main side 86 of the sixth semiconductor layer 8 and a eight main side 98 opposite to the seventh main side 97. The eighth main side 98 becomes, for example, the second main side 22 of the final device. The seventh semiconductor layer 9 is, for example, formed by epitaxy as described above with respect to FIG. 6C.

Figure 6F:
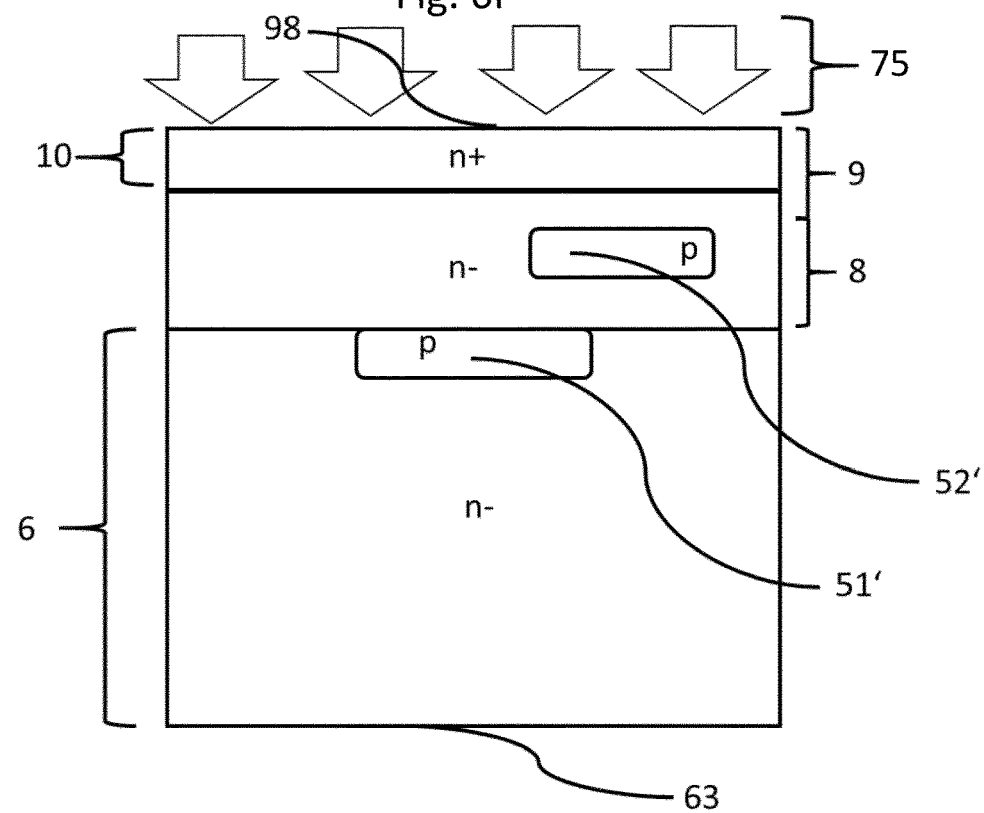

Referring to FIG. 6F, the method further comprises a step of forming an eighth semiconductor layer 10 of the second conductivity type in the seventh semiconductor layer 9 adjacent to eighth main side 98 by implanting dopants 75 of the second conductivity type at the eighth main side 98 into the seventh semiconductor layer 9.

Figure 6G:
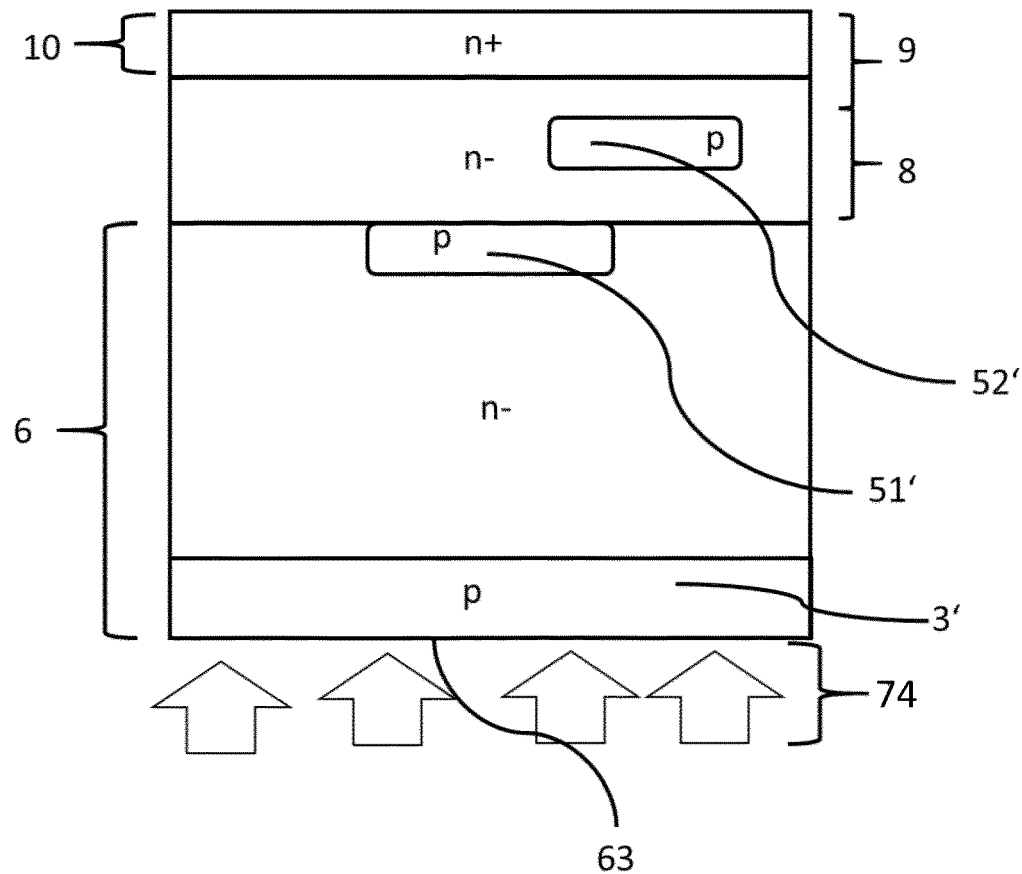

Referring to FIG. 6G, the method further comprises a step of implanting third dopants 74 of the first conductivity type into a first layer 3' in the semiconductor substrate 6 at the third main side 63.

Figure 6H:
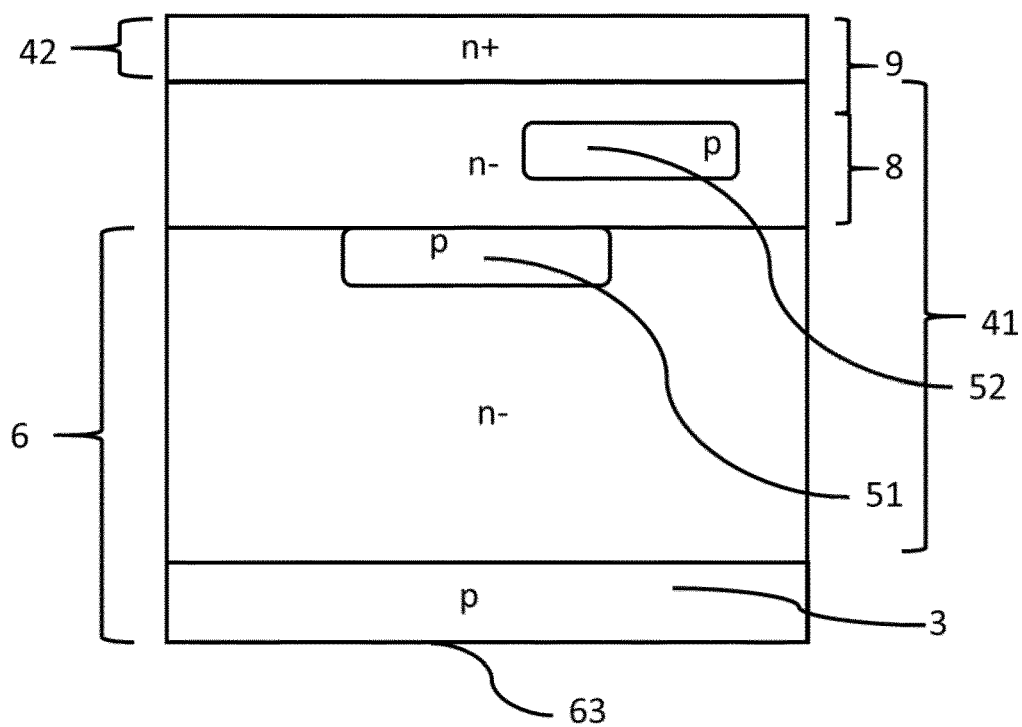

Referring to FIG. 6H, the method further comprises at least one annealing step to activate at least the implanted first dopants 72 and the implanted second dopants 73. The at least one annealing step may be a global annealing step in which all implanted dopants 72, 73, 74, 75 are activated together. Alternatively, individual annealing steps may be performed after the individual implantation steps. For example, a first annealing step may be performed after the implantation of the first dopants 72 into the first region 51' and before the implantation of the second dopants 73 into the second region 52', a second annealing step may be performed after the implantation of the second dopants 73 into second region 52' and before the forming of the seventh semiconductor layer 9, a third annealing step may be performed after the forming of the eighth semiconductor layer 10, and a fourth annealing step may be performed after the implantation into the first layer 3'. The two approaches may also be mixed such that several activation steps are performed but a subset of the implanted dopants is activated together.

Due to the at least one annealing step, the first region 51' becomes the first semiconductor region 51 of the final device, the second region 52' becomes the second semiconductor region 52 of the final device, the first layer 3' becomes the first semiconductor layer 3 of the final device, a portion of the semiconductor substrate 6 adjacent to the sixth semiconductor layer 8, the sixth semiconductor layer 8 and a portion of the seventh semiconductor layer 9 adjacent to the sixth semiconductor layer 8 become the third semiconductor layer 41 of the final device, and the eight semiconductor layer 10 becomes the fourth semiconductor layer 42 of the final device.

The annealing may be performed by furnace annealing, flash lamp annealing or laser annealing. Performing individual annealing steps based on laser annealing instead of a global annealing step by furnace or flash lamp annealing are beneficial in view of reducing a diffusion of dopants and thus steeper doping concentration profiles may be obtained.

Optionally, in order to better control the doping profile of the second semiconductor layer 4 of the final device, an ninth semiconductor layer (not shown) of the second conductivity type and having a ninth main side which coincides with the eighth main side 98 of the seventh semiconductor layer 9 and a tenth main side opposite to the ninth main side, is formed on the tenth semiconductor layer 8, using a similar process as described for forming the sixth, seventh and eight semiconductor layers 8, 9, 10. In such a case, the tenth main side becomes, for example, the second main side 22 of the final device.

Figure 6I:
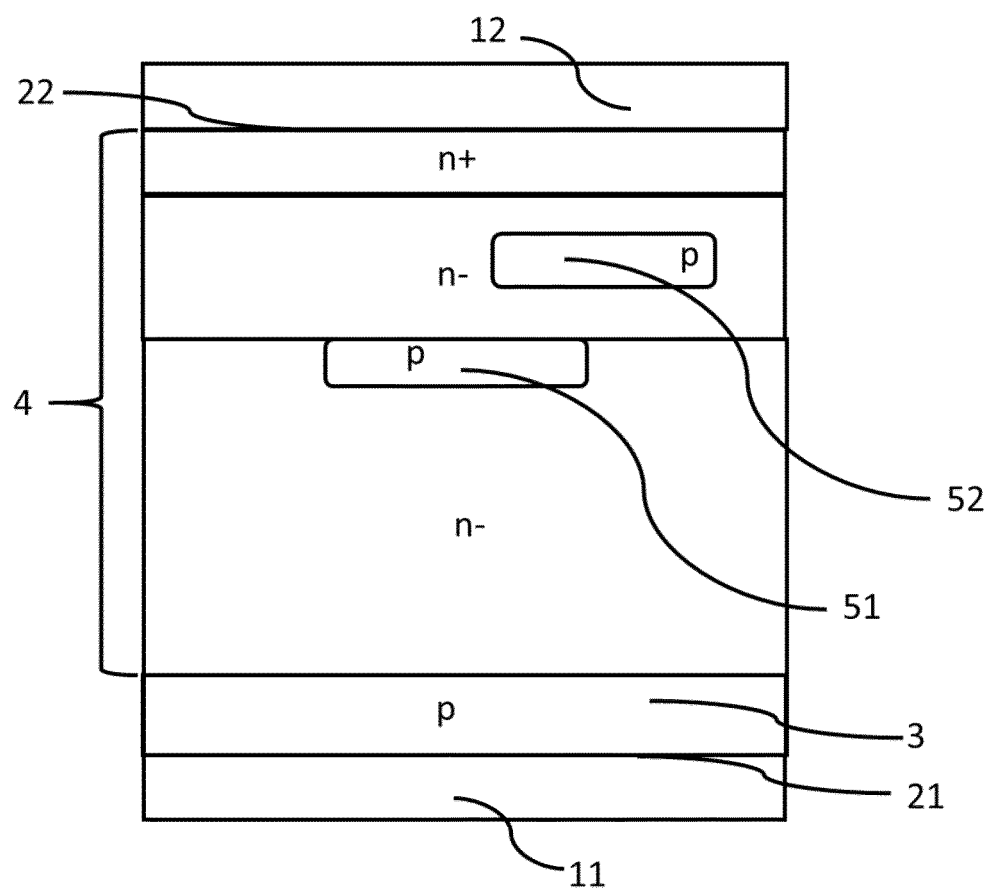

Referring to FIG. 6I, the method further comprises a step of forming the first electrode layer 11 on the first main side 21 and a step of forming the second electrode layer 12 on the second main side 22.

The above described epitaxial process can be performed at a high temperature, e.g., above 450° C., or a low temperature, e.g., below 450° C. Performing the epitaxial process at low temperature has the effect that diffusion of implanted dopants is reduced. Thus, first and second semiconductor regions 51, 52 with a steeper doping concentration profile at an interface to the surrounding second semiconductor layer 4 (e.g., a more localized first semiconductor region 51') is obtained.

A thickness th8 to which the sixth semiconductor layer 8 is grown, corresponds, for example, to a difference between the first distance d21 of the first semiconductor region 51 to the second main side 22 and the second distance d22 of the second semiconductor region 52 to the second main side 22 in the final device (after the at least one annealing step), i.e., th8=d21−d22.

A thickness th9 to which the seventh semiconductor layer 9 is grown corresponds, for example, to the distance d22 of the second semiconductor region 52 to the second main side 22 (after the at least one annealing step), i.e., th9=d22.

It will be apparent for persons skilled in the art that modifications of the above described embodiments are possible without departing from the idea of the invention as defined by the appended claims.

The above embodiments are described for one first semiconductor region 51 and one second semiconductor region 52. However, the semiconductor device may also comprise more than one first and/or second semiconductor region 51, 52. Then the described concepts apply mutatis mutandis.

In the above embodiments, the first and second semiconductor regions 51, 52 are described as being mutually separated. However, in a different embodiment, they may also touch each other.

The above embodiments it is described that dopants 72, 73, 74, 75 are implanted. Implantation is one possibility to apply dopants and embodiments are not limited thereto. Deposition or epitaxy may also be suitable.

The above embodiments describe a diode. However, the characteristic features of the invention are not limited to a diode; other devices could also comprise the described diode-like structures and the same advantageous technical effect would be observed. The described diode-like structure could also constitute a unit cell of a semiconductor device and the semiconductor device could comprise a plurality of such unit cells, for example, replicated in a horizontal direction. The semiconductor wafer 2 does not necessarily refer to an entire wafer but may also refer to a chip diced out of a wafer.

In the above embodiments, the first conductivity type is p-type conductivity and the second conductivity type is n-type conductivity. However, the conductivity types may also be switched, i.e., the first conductivity type may be n-type conductivity and the second conductivity type may be p-type conductivity.

It should be noted that the term "comprising" does not exclude other elements or steps and that the indefinite article "a" or "an" does not exclude the plural.

LIST OF REFERENCE SIGNS 11 first electrode layer
12 second electrode layer
2 semiconductor wafer
21 first main side
22 second main side
3 first semiconductor layer of first conductivity type
3' first layer (before activation)
4 second semiconductor layer of second conductivity type
41 third semiconductor layer of second conductivity type
42 fourth semiconductor layer of second conductivity type
43 fifth semiconductor layer of second conductivity type
5 first pn junction
51 first semiconductor region of first conductivity type
51' first region (before activation)
52 second semiconductor region of first conductivity type
52' second region (before activation)
53 third semiconductor region of first conductivity type
6 semiconductor substrate
63 third main side
64 fourth main side
71, 76 patterned mask
72, 73, 74 dopants of first conductivity type
75 dopants of second conductivity type
8 sixth semiconductor layer (second conductivity type)
85 fifth main side
86 sixth main side
9 seventh semiconductor layer (second conductivity type)
97 seventh main side
98 eighth main side
10 eight semiconductor layer (second conductivity type)
d11 distance from first semiconductor region to first main side
d12 distance from second semiconductor region to first main side
d21 distance from first semiconductor region to second main side
d22 distance from second semiconductor region to second main side
th51 thickness of first semiconductor region
th52 thickness of second semiconductor region
th53 thickness of third semiconductor region
w51 width of first semiconductor region
w52 width of second semiconductor region
w53 width of third semiconductor region
th8 thickness of sixth semiconductor layer
th9 thickness of seventh semiconductor layer
c51 maximal doping concentration of first semiconductor region
c52 maximal doping concentration of second semiconductor region

The invention claimed is:

1. A semiconductor device comprising:
a first semiconductor layer of a first conductivity type at a first main side of a semiconductor wafer;
a first electrode layer at the first main side and in ohmic contact with the first semiconductor layer;
a second semiconductor layer of a second conductivity type, the second semiconductor layer forming a first pn junction with the first semiconductor layer;
a third semiconductor layer of the second conductivity type at a second main side of the semiconductor wafer, the third semiconductor layer having a maximal doping concentration that is at least one order of magnitude higher than a maximal doping concentration of the second semiconductor layer;
a second electrode layer at the second main side and in ohmic contact with the third semiconductor layer;
a fourth semiconductor layer of the second conductivity type between the second semiconductor layer and the third semiconductor layer, the fourth semiconductor layer having a maximal doping concentration that is lower than the maximal doping concentration of the third semiconductor layer and that is higher than the maximal doping concentration of the second semiconductor layer;
a first semiconductor region of the first conductivity type completely embedded in the fourth semiconductor layer; and
a second semiconductor region of the first conductivity type completely embedded in the fourth semiconductor layer, wherein during reverse recovery, a first conductivity type charge carrier injection duration of the first semiconductor region is different from a first conductivity type charge carrier injection duration of the second semiconductor region.

2. The semiconductor device according to claim 1, wherein a distance from the first semiconductor region to the second main side is different than a distance of the second semiconductor region to the second main side.

3. The semiconductor device according to claim 1, wherein a distance of the first semiconductor region to the first main side is different from a distance of the second semiconductor region to the first main side.

4. The semiconductor device according to claim 1, wherein the first semiconductor region overlaps with the second semiconductor region in an orthogonal projection onto a plane parallel to the second main side.

5. The semiconductor device according to claim 1, wherein a maximal doping concentration of the first semiconductor region is different than a maximal doping concentration of the second semiconductor region.

6. The semiconductor device according to claim 1, wherein the first semiconductor region and the second semiconductor region do not overlap with each other in each orthogonal projection onto a plane perpendicular to the second main side.

7. The semiconductor device according to claim 1, wherein the first semiconductor region and the second semiconductor region are separated from each other.

8. The semiconductor device according to claim 1, wherein the first semiconductor region and the second semiconductor region are closer to the second main side than to the first pn junction.

9. The semiconductor device according to claim 1, wherein a thickness of the first semiconductor region is substantially the same as a thickness of the second semiconductor region when thickness is measured in a direction from the first main side to the second main side.

10. The semiconductor device according to claim 1, wherein a thickness of the first semiconductor region is different than a thickness of the second semiconductor region when thickness is measured in a direction from the first main side to the second main side.

11. A semiconductor device comprising:
a first semiconductor layer of a first conductivity type at a first main side of a semiconductor wafer;
a first electrode layer at the first main side and in ohmic contact with the first semiconductor layer;
a second semiconductor layer of a second conductivity type, the second semiconductor layer forming a pn junction with the first semiconductor layer;
a third semiconductor layer of the second conductivity type at a second main side of the semiconductor wafer, the third semiconductor layer having a maximal doping concentration that is at least one order of magnitude higher than a maximal doping concentration of the second semiconductor layer;
a second electrode layer at the second main side and in ohmic contact with the third semiconductor layer;
a fourth semiconductor layer of the second conductivity type between the second semiconductor layer and the third semiconductor layer, the fourth semiconductor layer having a maximal doping concentration that is lower than the maximal doping concentration of the third semiconductor layer and that is higher than the maximal doping concentration of the second semiconductor layer;
a first semiconductor region of the first conductivity type completely embedded in the fourth semiconductor layer, the first semiconductor region spaced from the first main side by a first distance and spaced from the second main side by a second distance; and
a second semiconductor region of the first conductivity type completely embedded in the fourth semiconductor layer and separated from the first semiconductor region, the second semiconductor region spaced from the first main side by a third distance that is different than the first distance and spaced from the second main side by a fourth distance that is different than the second distance, wherein a maximal doping concentration of the second semiconductor region is less than or equal to a maximal doping concentration of the first semiconductor region.

12. The semiconductor device according to claim 11, wherein the first semiconductor region overlaps with the second semiconductor region in an orthogonal projection onto a plane parallel to the second main side.

13. The semiconductor device according to claim 11, wherein the first semiconductor region and the second semiconductor region do not overlap with each other in each orthogonal projection onto a plane perpendicular to the second main side.

14. A method for manufacturing a power semiconductor device, the method comprising:
providing a semiconductor wafer having a first main side and a second main side, the semiconductor wafer comprising:
a first semiconductor layer of a first conductivity type at the first main side;
a second semiconductor layer of a second conductivity type, the second semiconductor layer forming a pn junction with the first semiconductor layer;
a third semiconductor layer of the second conductivity type at the second main side, the third semiconductor layer having a maximal doping concentration that is at least one order of magnitude higher than a maximal doping concentration of the second semiconductor layer;
a fourth semiconductor layer of the second conductivity type between the second semiconductor layer and the third semiconductor layer, the fourth semiconductor layer having a maximal doping concentration that is lower than the maximal doping concentration of the third semiconductor layer and that is higher than the maximal doping concentration of the second semiconductor layer;
a first semiconductor region of the first conductivity type completely embedded in the fourth semiconductor layer; and
a second semiconductor region of the first conductivity type completely embedded in the fourth semiconductor layer and spaced from the first semiconductor region, wherein during reverse recovery, a first conductivity type charge carrier injection duration of the first semiconductor region is different from a first conductivity type charge carrier injection duration of the second semiconductor region;
forming a first electrode layer at the first main side and in ohmic contact with the first semiconductor layer; and
forming a second electrode layer at the second main side and in ohmic contact with the third semiconductor layer.

15. The method of claim 14, further comprising forming the semiconductor wafer, wherein forming the semiconductor wafer comprises:
providing a semiconductor substrate of the second conductivity type, the semiconductor substrate having a third main side and a fourth main side opposite to the third main side;
applying first dopants of the first conductivity type at the fourth main side for forming the first semiconductor region;
thereafter, forming a fifth semiconductor layer of the second conductivity type on the fourth main side, the fifth semiconductor layer having a fifth main side coinciding with the fourth main side and a sixth main side opposite to the fifth main side;
thereafter, applying second dopants of the first conductivity type at the sixth main side for forming the second semiconductor region;
thereafter, forming a sixth semiconductor layer of the second conductivity type on the sixth main side, the sixth semiconductor layer having a seventh main side coinciding with the sixth main side and an eighth main side opposite to the seventh main side; and
annealing the substrate to activate the applied first dopants and the applied second dopants thereby forming the first semiconductor region and the second semiconductor region.

16. The method according to claim 15, wherein the fifth semiconductor layer and the sixth semiconductor layer are formed by epitaxy.

17. The method according to claim 15, wherein the fifth semiconductor layer and the sixth semiconductor layer are formed at a temperature below 450° C.

18. The method according to claim 17, wherein annealing the substrate comprises:
performing a first annealing step to activate the applied first dopants before the step of forming the fifth semiconductor layer; and
performing a second annealing step to activate the applied second dopants before the step of forming the sixth semiconductor layer and after the first annealing step.

19. The method according to claim 14, wherein a distance from the first semiconductor region to the second main side is different than a distance of the second semiconductor region to the second main side; and a distance of the first semiconductor region to the first main side is different from a distance of the second semiconductor region to the first main side.

20. The method according to claim 14, wherein a maximal doping concentration of the first semiconductor region is different than a maximal doping concentration of the second semiconductor region.

\* \* \* \* \*